(12) United States Patent
Motokawa et al.

(10) Patent No.: US 11,931,923 B2
(45) Date of Patent: Mar. 19, 2024

(54) METHOD OF MANUFACTURING TEMPLATE AND METHOD OF FORMING PATTERN

(71) Applicant: Kioxia Corporation, Tokyo (JP)

(72) Inventors: Takeharu Motokawa, Kanagawa (JP); Hideaki Sakurai, Kanagawa (JP); Noriko Sakurai, Kanagawa (JP); Ryu Komatsu, Kanagawa (JP)

(73) Assignee: Kioxia Corporation, Tokyo (JP)

( * ) Notice: Subject to any disclaimer, the term of this patent is extended or adjusted under 35 U.S.C. 154(b) by 556 days.

(21) Appl. No.: 17/115,955

(22) Filed: Dec. 9, 2020

(65) Prior Publication Data
US 2021/0291408 A1    Sep. 23, 2021

(30) Foreign Application Priority Data
Mar. 19, 2020   (JP) ................ 2020-048759

(51) Int. Cl.
*G03F 7/00*      (2006.01)
*B29C 33/38*     (2006.01)
*B29L 31/00*     (2006.01)
*H01L 21/027*    (2006.01)

(52) U.S. Cl.
CPC ........ *B29C 33/3842* (2013.01); *G03F 7/0002* (2013.01); *B29K 2905/08* (2013.01); *B29K 2907/04* (2013.01); *B29L 2031/757* (2013.01); *H01L 21/0271* (2013.01)

(58) Field of Classification Search
CPC ............................ G03F 7/0005; G03F 7/0002
See application file for complete search history.

(56) References Cited

U.S. PATENT DOCUMENTS

| 9,299,609 B2 * | 3/2016 | Yang ................ G03F 7/0002 |
| 10,459,335 B2 | 10/2019 | Komukai |
| 2003/0186524 A1 * | 10/2003 | Ryo .................. H01L 21/76843 |
| | | 257/E21.585 |

(Continued)

FOREIGN PATENT DOCUMENTS

| JP | 2013168604 A * | 8/2013 |
| JP | 2014-103323 A | 6/2014 |

(Continued)

OTHER PUBLICATIONS

JP 2020-048759—Notice of Reasons for Refusal.

*Primary Examiner* — Cachet I Proctor
(74) *Attorney, Agent, or Firm* — Finnegan, Henderson, Farabow, Garrett & Dunner, LLP

(57) ABSTRACT

A method of manufacturing a template, has: preparing a substrate containing quartz and having a surface, the surface including a protrusion and a depression; and processing the depression. The processing of the depression includes: a first step of forming a film on the surface, the film including a first region and a second region, the first region being provided on the protrusion, and the second region being provided on a bottom of the depression and being thinner than the first region; a second step of removing the second region with the first region partly remaining to expose the bottom of the depression; and a third step of processing the exposed part of the depression using a mask made of the remainder of the first region.

15 Claims, 18 Drawing Sheets

(56) References Cited

U.S. PATENT DOCUMENTS

| | | | | |
|---|---|---|---|---|
| 2004/0005444 A1* | 1/2004 | Heidari | ............... | H01L 21/0331 |
| | | | | 257/E21.034 |
| 2006/0102587 A1* | 5/2006 | Kimura | .................... | C23F 4/00 |
| | | | | 216/41 |
| 2010/0308513 A1* | 12/2010 | Kashiwagi | ............. | B82Y 10/00 |
| | | | | 264/496 |
| 2012/0149192 A1* | 6/2012 | Brown | ................ | C23C 14/3492 |
| | | | | 438/653 |
| 2016/0247687 A1 | 8/2016 | Horiguchi | | |

FOREIGN PATENT DOCUMENTS

| | | | | |
|---|---|---|---|---|
| JP | 2016-66667 | A | | 4/2016 |
| JP | 2016066667 | A | * | 4/2016 |
| JP | 2016-92360 | A | | 5/2016 |
| JP | 2016-157782 | A | | 9/2016 |
| JP | 2016-161747 | A | | 9/2016 |
| JP | 2016161747 | A | * | 9/2016 |
| JP | 2018046212 | A | * | 3/2018 |
| JP | 2018-152478 | A | | 9/2018 |

\* cited by examiner

FIG.2
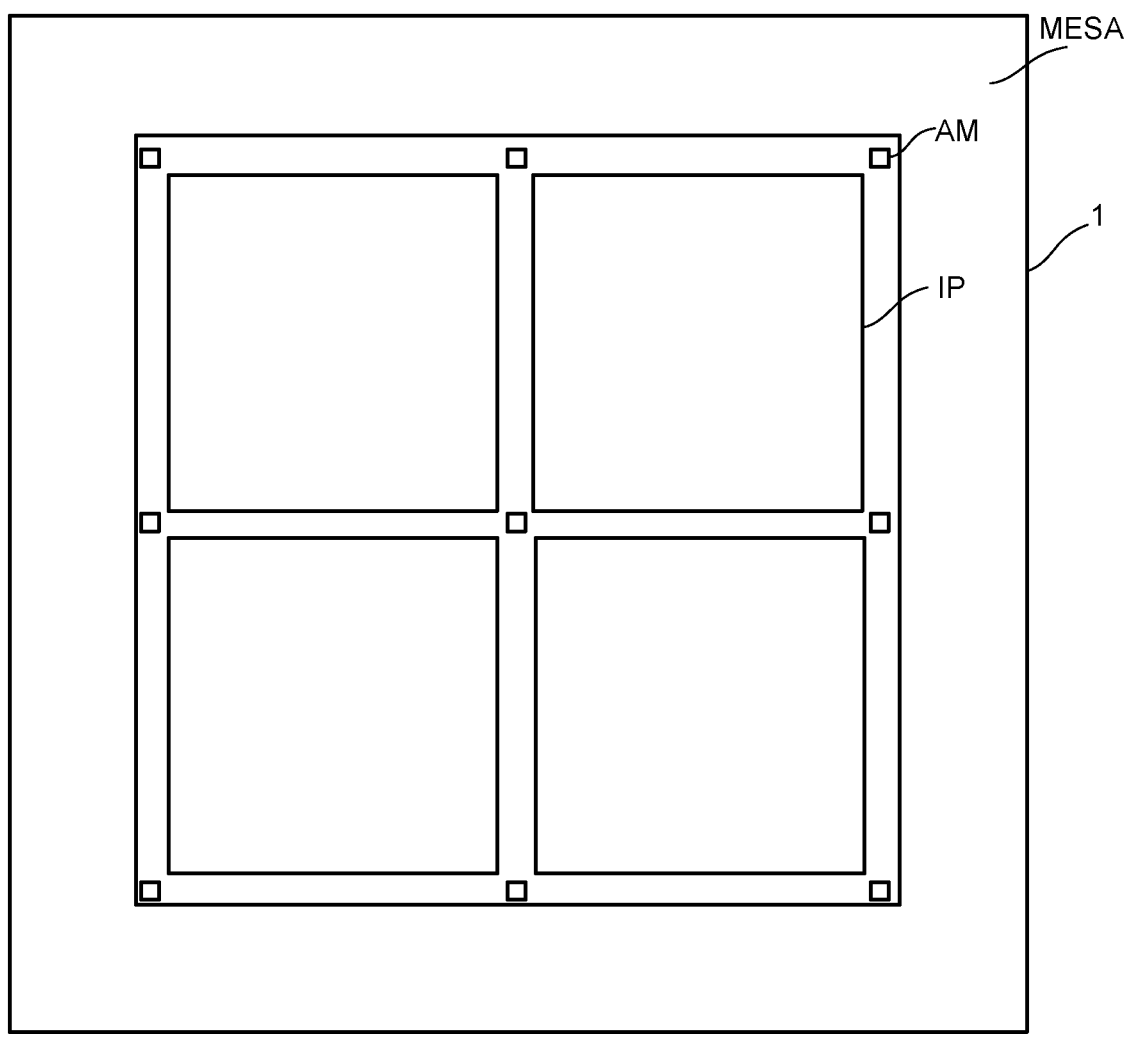
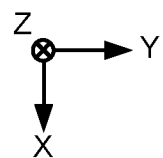

METHOD OF MANUFACTURING TEMPLATE AND METHOD OF FORMING PATTERN

CROSS-REFERENCE TO RELATED APPLICATION

This application is based upon and claims the benefit of priority from Japanese Patent Application No. 2020-48759, filed on Mar. 19, 2020; the entire contents of which are incorporated herein by reference.

FIELD

Embodiments described herein relate generally to a method of manufacturing a template and a method of forming a pattern.

BACKGROUND

Known method examples of manufacturing a semiconductor device, include forming a fine pattern using nanoimprint lithography (NIL).

BRIEF DESCRIPTION OF THE DRAWINGS

FIG. 2 is a schematic upper view for explaining a layout example of the template.

DETAILED DESCRIPTION

Figure 1:
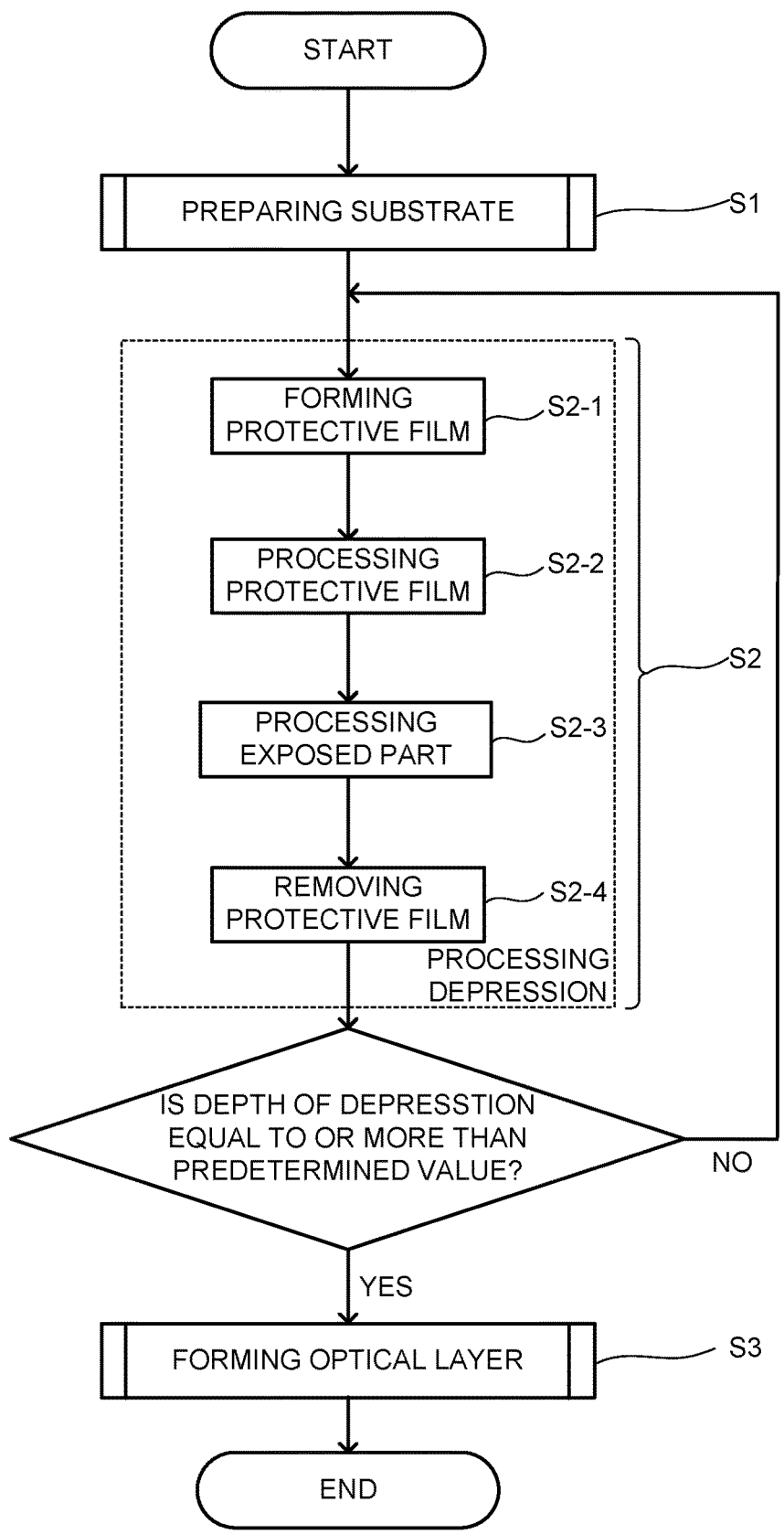
FIG. 1 is a flowchart for explaining a method example of manufacturing a template of a first embodiment.

A method of manufacturing a template of an embodiment has: preparing a substrate containing quartz and having a surface, the surface including a protrusion and a depression; and processing the depression. The processing the depression includes: a first step of forming a film on the surface, the film including a first region and a second region, the first region being provided on the protrusion, and the second region being provided on a bottom of the depression and being thinner than the first region; a second step of removing the second region with the first region partly remaining to expose the bottom of the depression; and a third step of processing the exposed part of the depression using a mask made of the remainder of the first region.

Hereinafter, embodiments will be described with reference to the drawings. A relation between a thickness and a planer dimension of each constituent element illustrated in the drawing, a thickness ratio among the constituent elements, and so on may be different from actual ones. Further, in the embodiments, substantially the same constituent elements are denoted by the same reference signs, and explanation thereof will be omitted when appropriate.

First Embodiment (A Method Example of Manufacturing a Template)

FIG. 1 is a flowchart for explaining a method example of manufacturing a template of a first embodiment. The method example of the first embodiment has a substrate preparation process S1, a depression processing process S2, and an optical layer forming process S3, as illustrated in FIG. 1.

A method of forming a pattern using NIL, includes: pressing a template onto an imprint material layer on an object, the imprint material layer having an imprint material such as an ultraviolet curing resin; irradiating the imprint material layer with light to cure the imprint material layer; and transferring a pattern to the imprint material layer. The pattern forming method includes alignment that aligns a position of the template and a position of the object before pressing the template. The alignment enables pattern transfer to the imprint material layer with high positional accuracy.

Examples of a typical template include a master template being an original plate and a replica template to be manufactured using the master template. In the embodiment, a manufacturing method example of the master template will be described as one of the examples.

FIG. 2 is a schematic upper view for explaining a layout example of the template and illustrates a part of an X-Y plane which includes an X axis of the substrate 1 and a Y axis orthogonal to the X axis. The layout example of the template has at least one alignment mark AM and at least one imprint pattern IP which are provided on a plane MESA, as illustrated in FIG. 2. FIG. 2 illustrates a plurality of the alignment marks AM and a plurality of the imprint patterns IP.

The numbers, positions, and shapes of the alignment mark AM and the imprint pattern IP are not limited in particular. The alignment mark AM and the imprint pattern IP may include a line-and-space pattern, for example.

[Substrate Preparation Process S1]

Figure 3:
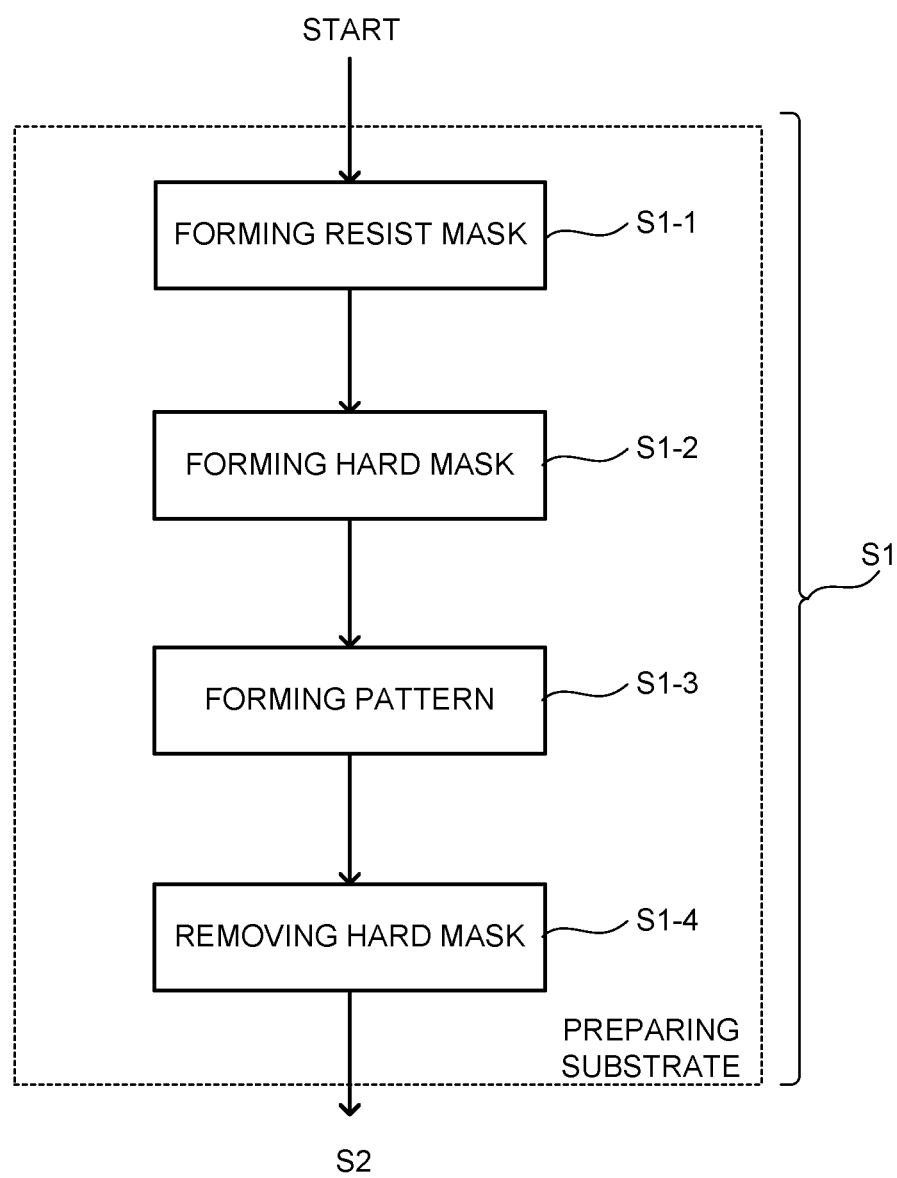
FIG. 3 is a flowchart for explaining an example of a substrate preparation process S1.

FIG. 3 is a flowchart for explaining an example of a substrate preparation process S1. The example of the substrate preparation process S1 includes a resist mask forming step S1-1, a hard mask forming step S1-2, a pattern forming step S1-3, and a hard mask removing step S1-4, as illustrated in FIG. 3.

Figure 4:
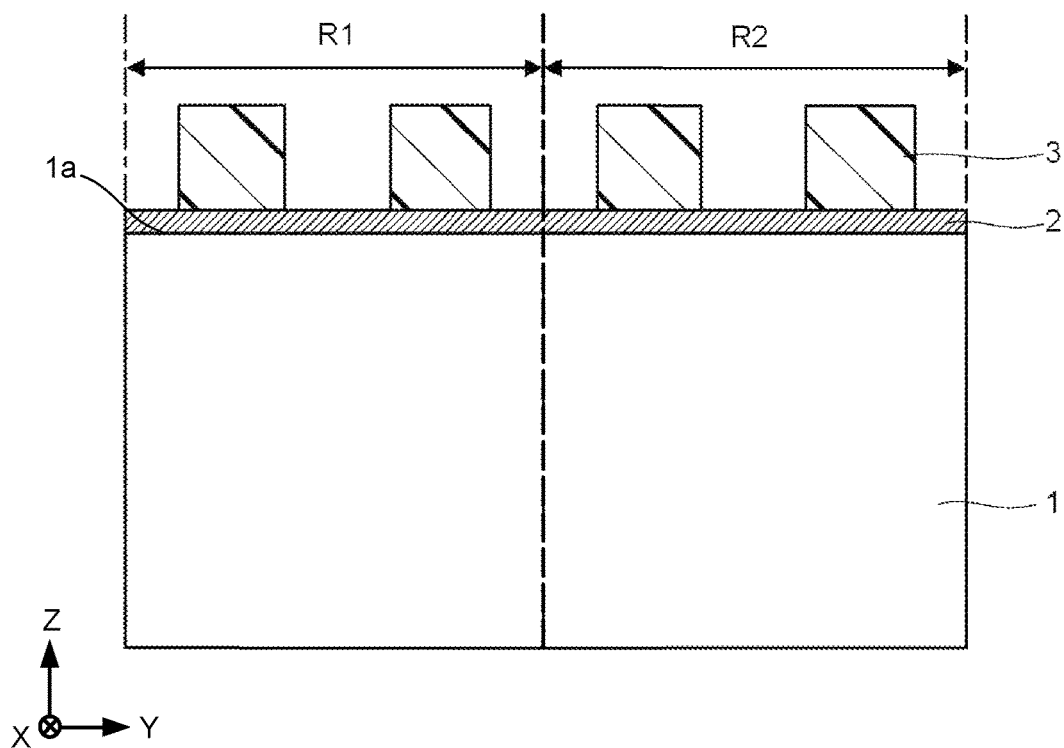
FIG. 4 is a schematic sectional view for explaining an example of a resist mask forming step S1-1.

FIG. 4 is a schematic sectional view for explaining an example of the resist mask forming step S1-1 and illustrates a part of a Y-Z cross section which includes the Y axis of the substrate 1 and a Z axis orthogonal to the X axis and the Y axis. FIG. 4 illustrates a region R1 and a region R2 schematically for the sake of convenience. One of the region R1 and the region R2 is a region in which the alignment mark AM is formed, for example, and the other is a region in which the imprint pattern IP is formed, for example. The resist mask forming step S1-1 can form a resist mask layer 3 with a pattern on a hard mask layer 2 provided on a surface 1a of the substrate 1.

The substrate 1 contains quartz, for example. The substrate 1 preferably transmits light. An oxide film may be provided on the surface 1a of the substrate 1.

The hard mask layer 2 has a function as a hard mask for processing the substrate 1. The hard mask layer 2 contains chromium (Cr), for example.

The resist mask layer 3 has a function as a resist mask for processing the hard mask layer 2. The resist mask layer 3 is formed through processing a photoresist-containing film using electron beam (EB) exposure, for example.

Figure 5:
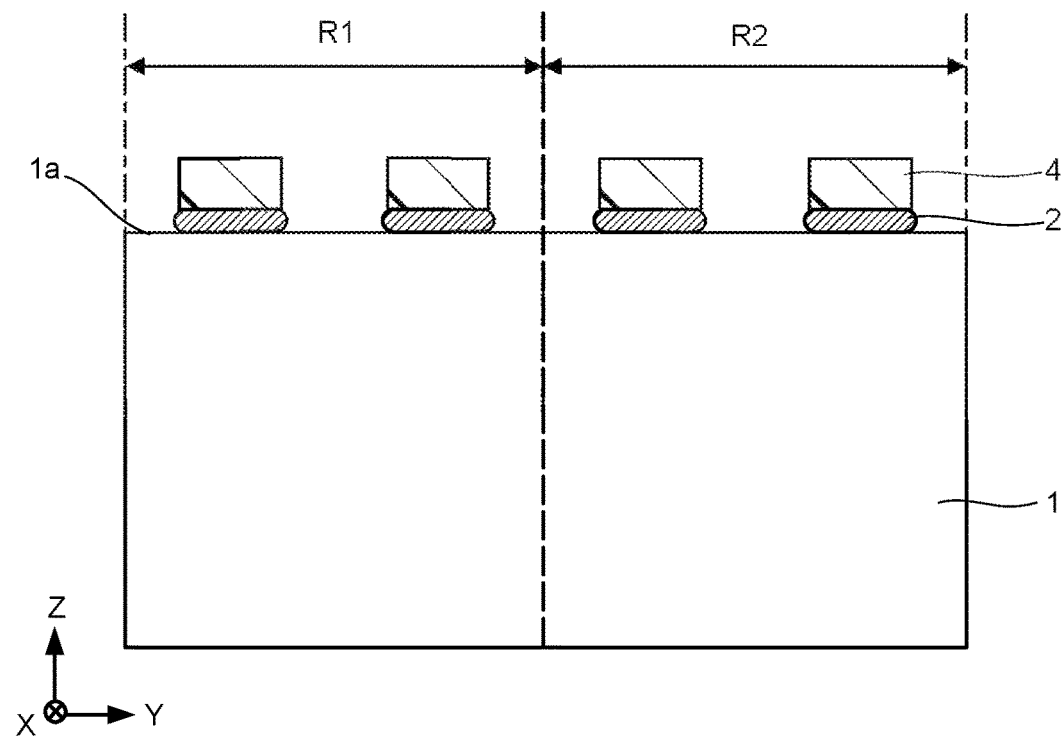
FIG. 5 is a schematic sectional view for explaining an example of a hard mask forming step S1-2.

FIG. 5 is a schematic sectional view for explaining an example of the hard mask forming step S1-2 and illustrates a part of the Y-Z cross section of the substrate 1. The hard mask forming step S1-2 can process the hard mask layer 2 using the resist mask layer 3, to thereby form a pattern of the hard mask layer 2. The hard mask layer 2 is processed by dry processing, for example. The dry processing is dry etching or ashing, for example. A method of dry processing is selected appropriately in accordance with a material of an object to be processed, for example.

Figure 6:
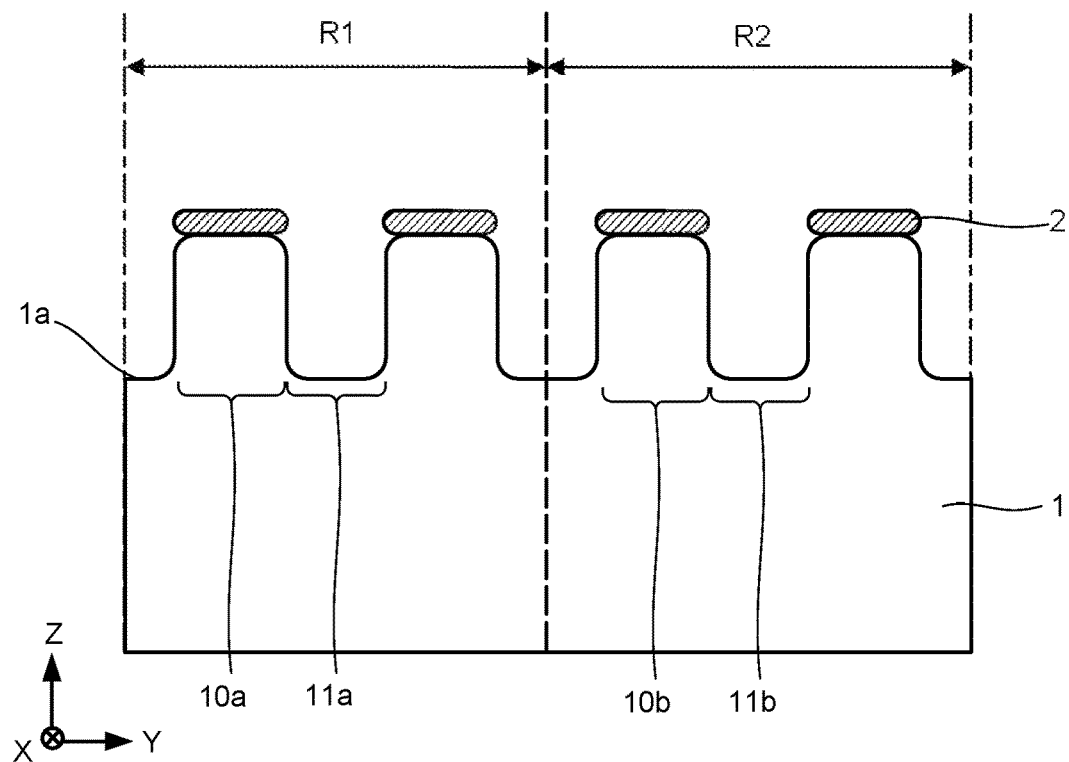
FIG. 6 is a schematic sectional view for explaining an example of a pattern forming step S1-3.

FIG. 6 is a schematic sectional view for explaining an example of the pattern forming step S1-3 and illustrates a part of the Y-Z cross section of the substrate 1. The pattern forming step S1-3 can process the substrate 1 using the hard mask layer 2, to thereby form a first pattern and a second pattern, the first pattern including a protrusion 10a and a depression 11a in the first region R1, the second pattern including a protrusion 10b and a depression 11b in the second region R2. It is also acceptable to form at least one of a plurality of protrusions 10a, a plurality of protrusions 10b, a plurality of depressions 11a, and a plurality of depressions 11b, through the pattern forming step S1-3.

Figure 7:
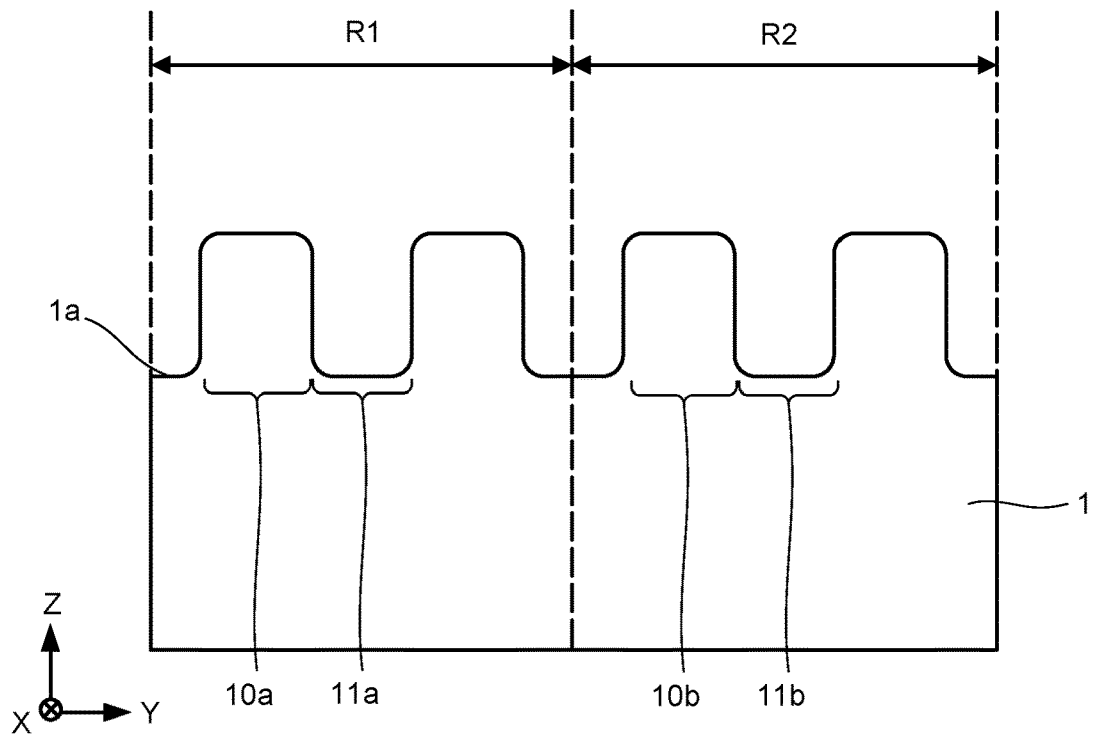
FIG. 7 is a schematic sectional view for explaining an example of a hard mask removing step S1-4.

FIG. 7 is a schematic sectional view for explaining an example of the hard mask removing step S1-4 and illustrates a part of the Y-Z cross section of the substrate 1. The hard mask removing step S1-4 can remove the hard mask layer 2. The hard mask layer 2 is removed by dry processing, for example. The above steps can prepare the substrate 1 with the surface 1a which has the first and second patterns.

[Depression Processing Process S2]

The depression processing process S2 includes a protective film forming step S2-1, a protective film processing step S2-2, an exposed part processing step S2-3, and a protective film removing step S2-4, as illustrated in FIG. 1.

Figure 8:
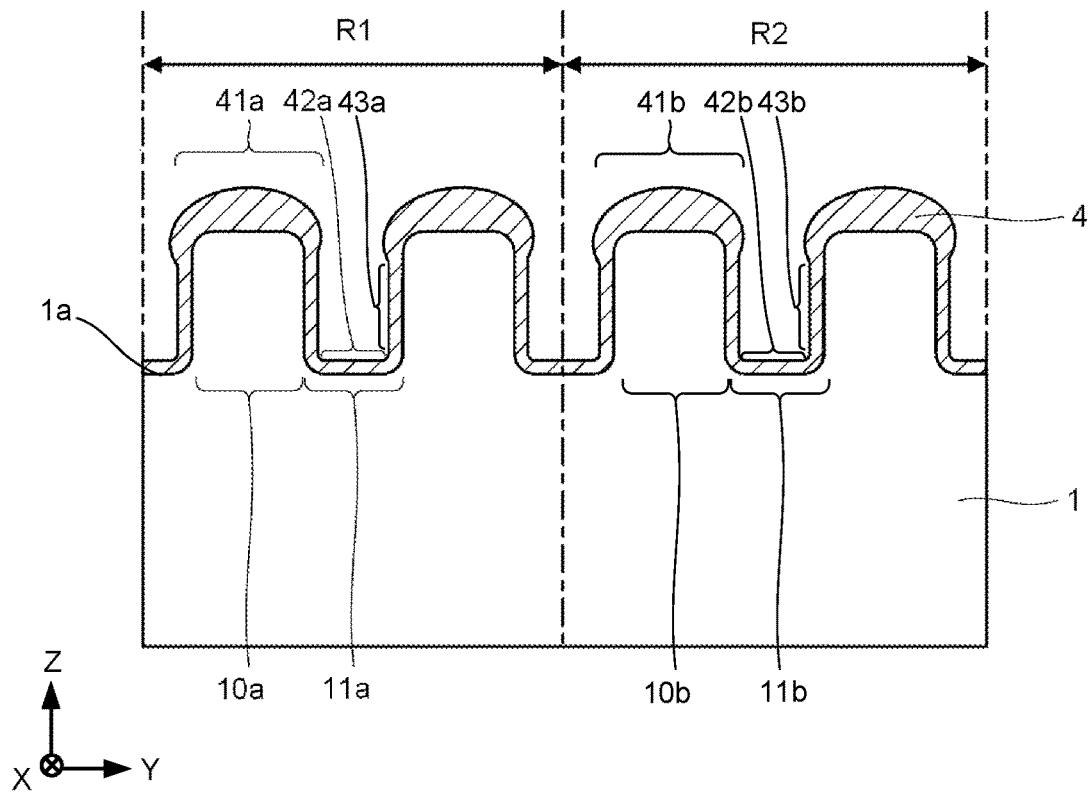
FIG. 8 is a schematic sectional view for explaining an example of a protective film forming step S2-1.

FIG. 8 is a schematic sectional view for explaining an example of the protective film forming step S2-1 and illustrates a part of the Y-Z cross section of the substrate 1. The protective film forming step S2-1 can form a protective film 4 on the surface 1a of the substrate 1.

The protective film 4 is formed by anisotropic sputtering, for example. The sputtering may be oblique incidence sputtering, for example. The oblique incidence sputtering collide target particles to the protrusion 10a, the protrusion 10b, the depression 11a, and the depression 11b along a direction inclining to the surface 1a.

The protective film 4 has a region 41a which is provided on a surface of the protrusion 10a, a region 42a which is provided on a bottom of the depression 11a and is thinner than the region 41a, a region 43a which is provided on an inner wall surface of the depression 11a and is thinner than the region 41a, a region 41b which is provided on a surface of the protrusion 10b, a region 42b which is provided on a bottom of the depression 11b and is thinner than the region 41b, and a region 43b which is provided on an inner wall surface of the depression 11b and is thinner than the region 41b. The region 41a and the region 41b illustrated in FIG. 8 have oval cross-sectional shapes, but the shapes of the region 41a and the region 41b are not limited to the shapes illustrated in FIG. 8.

In the protective film forming step S2-1, the protective film 4 having an uneven thickness is formed using electric field concentration to the protrusion 10a and the protrusion 10b, for example. Therefore, the protective film 4 preferably contains a dielectric material, for example.

An example of the protective film 4 may contain chromium. Chromium is hard to be removed by fluorine-based gas plasma which is used in processing of quartz. Further, chromium has a light transmittance lower than that of quartz. This enables easy detection of a pattern using a difference in light transmittance between chromium and quartz.

Another example of the protective film 4 may contain carbon. The contained carbon assists processing of quartz. Further, carbon has a light transmittance lower than that of quartz. This enables easy detection of a pattern using a difference in light transmittance between carbon and quartz. The protective film 4 containing carbon includes a diamond-like carbon (DLC) film, for example. The DLC film enables easy adjustment of a bonding state of elements. Therefore, usage of the DLC film enables easy adjustment of processing resistance of the protective film 4.

The protective film 4 may contain at least one element selected from the group consisting of tantalum (Ta), ruthenium (Ru), and molybdenum (Mo). Further, the protective film 4 may be formed by stacking of films containing an element applicable to the protective film 4 and may contain a plurality of elements.

Each thickness of the region 41a to the region 43a and the region 41b to the region 43b is preferably adjusted to be a thickness with which a defect such as a pinhole does not occur in the protective film 4. A ratio of a film-forming amount of the region 41a to a film-forming amount of the region 42a or a ratio of a film-forming amount of the region 41b to a film-forming amount of the region 42b is 1.6 or more, and further, 1.8 or more, for example. The ratio is obtained by a ratio of a thickness of a center part of the region 41a to a thickness of a center part of the region 42a or a ratio of a thickness of a center part of the region 41b to a thickness of a center part of the region 42b, for example. An upper limit of the ratio is determined in accordance with a film forming condition or a dimension of a pattern, for example.

Figure 9:
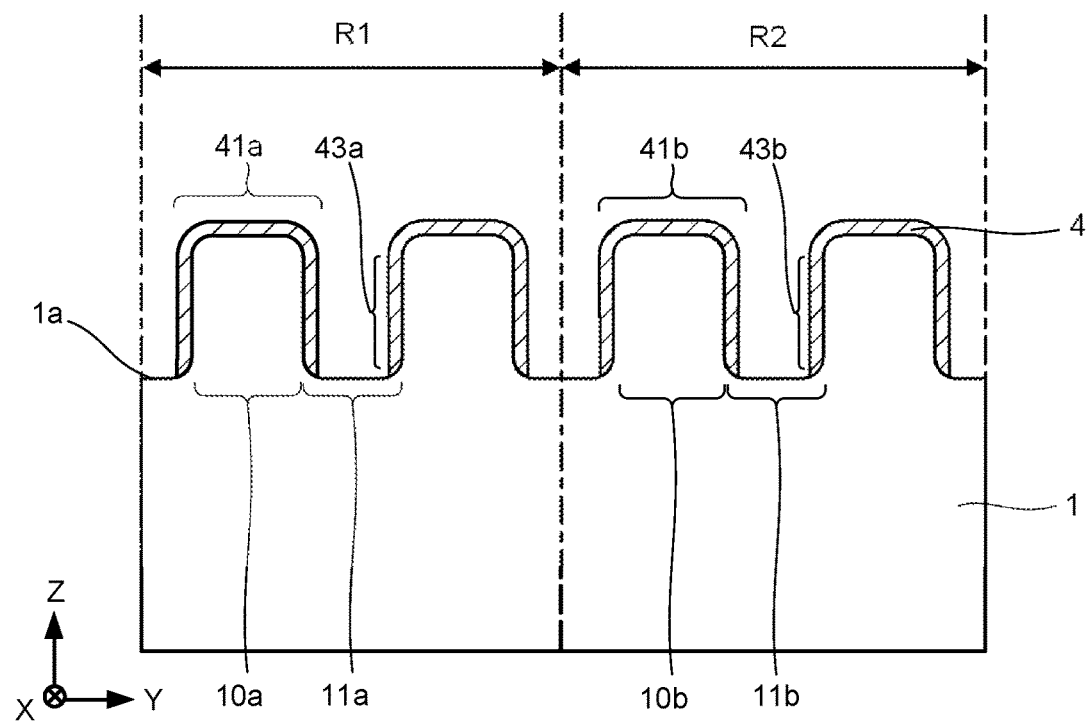
FIG. 9 is a schematic sectional view for explaining an example of a protective film processing step S2-2.

FIG. 9 is a schematic sectional view for explaining an example of the protective film processing step S2-2 and illustrates a part of the Y-Z cross section of the substrate 1. The protective film processing step S2-2 can remove the region 42a and the region 42b with the region 41a, the region 41b, the region 43a, and the region 43b each partly remaining, to thereby expose the bottom of the depression 11a and the bottom of the depression 11b.

The region 41a to the region 43a and the region 41b to the region 43b are processed by dry processing to the protective film 4, for example, and since the region 41a is thicker than the region 42a, the region 41b is thicker than the region 42b, and the region 43a and the region 43b extend in a direction (Z axis direction) almost parallel to an incident direction of the target particles, the region 42a and the region 42b are removed and the region 41a, the region 41b, the region 43a, and the region 43b partly remain. A remainder of the protective film 4 can be optically detected using a difference in light transmittance between the substrate 1 and the protective film 4, for example.

The dry processing to the protective film 4 containing chromium, uses plasma generated from gas containing chlorine ($Cl_2$) and oxygen ($O_2$), for example. A reaction between chromium and oxygen forms chromium oxide ($Cr_2O_3$), and then a reaction between chromium oxide ($Cr_2O_3$) and chlorine forms chromyl chloride ($CrCl_2O_2$) which is likely to be vaporized. These reactions enables partly removing the protective film 4.

The dry processing to the protective film 4 (for example, the DLC film) containing carbon, uses plasma generated from gas containing oxygen or nitrogen ($N_2$), for example. For example, a reaction between carbon and oxygen forms carbon dioxide ($CO_2$). When gas containing nitrogen ($N_2$) is used, nitrogen oxide ($NO_x$) is formed, for example. This reaction enables partly removing the protective film 4.

Figure 10:
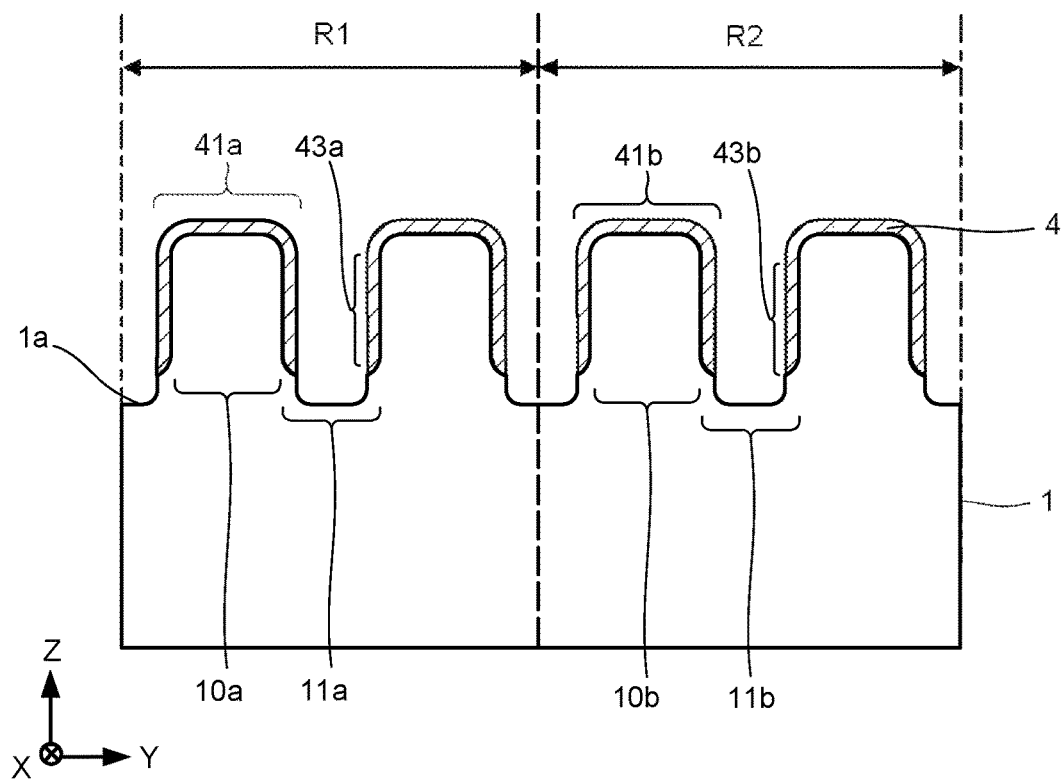
FIG. 10 is a schematic sectional view for explaining an example of an exposed part processing step S2-3.

FIG. 10 is a schematic sectional view for explaining an example of the exposed part processing step S2-3 and illustrates a part of the Y-Z cross section of the substrate 1. The exposed part processing step S2-3 can process an exposed part of the depression 11a using a mask made of remainders of the region 41a and the region 43a, and an exposed part of the depression 11b is processed using a mask made of remainders of the region 41b and the 43b. This enables the depression 11a and the depression 11b to be made further deep, for example.

The exposed part of the depression 11a and the exposed part of the depression 11b are processed by dry processing, for example. Since the inner wall surface of the depression 11a can be protected by the region 43a and the inner wall surface of the depression 11b can be protected by the region 43b, dimensional variability of the depression 11a and the depression 11b can be prevented. The exposed part processing step S2-3 can processes the depression 11a and the depression 11b with processing accuracy equal to or more than accuracy by atomic layer etching (ALE), for example.

The dry processing to the substrate 1 containing quartz, uses plasma generated from gas containing tetrafluoromethane ($CF_4$), for example. A reaction between silicon oxide ($SiO_2$) of quartz and $CF_4$ reduces silicon oxide, and then a reaction between silicon and fluoride forms silicon tetrafluoride ($SiF_4$) which is likely to be vaporized. This enables partly removing the substrate 1.

Figure 11:
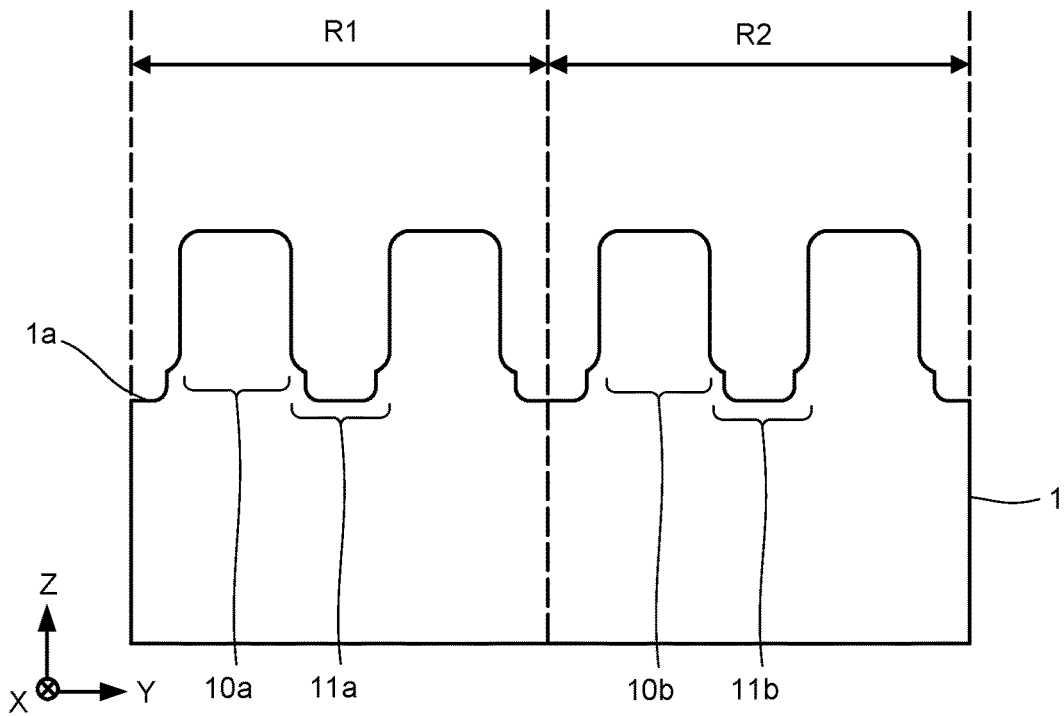
FIG. 11 is a schematic sectional view for explaining an example of a protective film removing step S2-4.

FIG. 11 is a schematic sectional view for explaining an example of the protective film removing step S2-4 and illustrates a part of the Y-Z cross section of the substrate 1. The protective film removing step S2-4 can remove the region 41a, the region 41b, the region 43a, and the region 43b. The region 41a, the region 41b, the region 43a, and the region 43b can be removed by dry processing, for example.

As illustrated in FIG. 1, the depression processing process S2 may be repeated until the depths of the depression 11a and the depression 11b attain predetermined values. This can enhance processing accuracy of the depths of the depression 11a and the depression 11b. The repetition number of the depression processing process S2 is not limited in particular.

[Optical Layer Forming Process S3]

Figure 12:
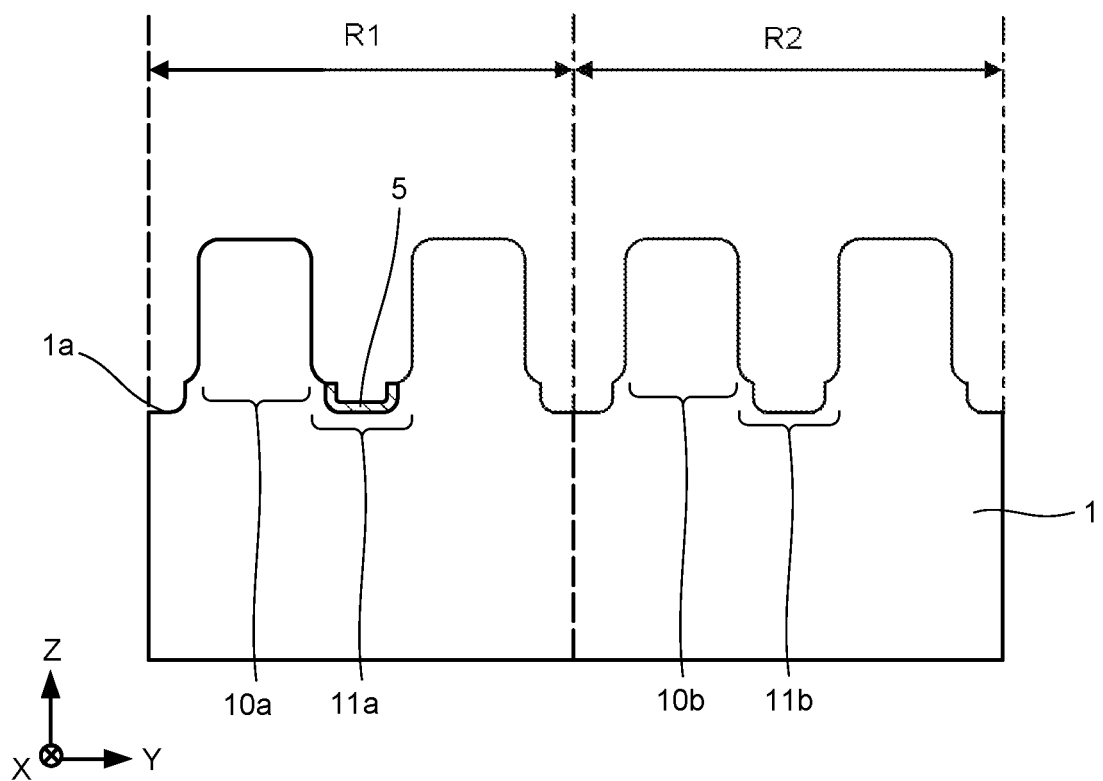
FIG. 12 is a schematic sectional view for explaining an example of an optical layer forming process S3.

FIG. 12 is a schematic sectional view for explaining an example of the optical layer forming process S3 and illustrates a part of the Y-Z cross section of the substrate 1. The optical layer forming process S3 can form an optical layer 5 in at least one depression 11a, as illustrated in FIG. 12. The optical layer 5 has a refractive index different from a refractive index of the substrate 1. The optical layer 5 contains chromium, for example. Not limited by the chromium, it suffices that the optical layer 5 includes at least one material selected from the group consisting of titanium, tantalum, tungsten, chromium, copper, silicon carbide, and silicon fluoride, for example. The optical layer 5 is formed, for example, by forming a mask layer covering a region other than the depression 11a and depositing a material applicable to the optical layer 5 in the depression 11a by sputtering. The provision of the optical layer 5 enables forming a contrast between the protrusion 10a and the depression 11a to easily detect the pattern. This can enhance accuracy of alignment between the template and the object.

As described above, the method example of the first embodiment, includes: forming the film on the surface of the substrate, the film having the first region and the second region, the first region being provided on the protrusion of the substrate, the second region being provided on the bottom portion of the depression, and the second region being thinner than the first region; removing the second region with the first region partly remaining to expose the bottom of the depression; and processing the exposed part of the depression using the mask made of the remainder of the first region.

A depth of the depression corresponds to a height of an imprint material layer (resist layer, for example) formed on an object using NIL, for example. Therefore, when the height of the imprint material layer is smaller than a predetermined height, it is difficult to process the object into a predetermined shape by using that imprint material layer. This may manufacture a new template to adjust the depth of the depression.

In contrast, the method example of the first embodiment can expose and process only the bottom of the depression using the difference in thickness between the first region and the second region, to form the depression to be further deep, for example. Therefore, the depth of the depression can be easily adjusted without a new template being manufactured.

Second Embodiment

A method example of manufacturing a template of a second embodiment has a substrate preparation process S1, a depression processing process S2, and an optical layer forming process S3, similarly to the method example of the first embodiment. In the second embodiment, explanation will be omitted for parts the same as those in the first embodiment and parts different from those in the first embodiment will be described in detail.

[Substrate Preparation Process S1]

Figure 13:
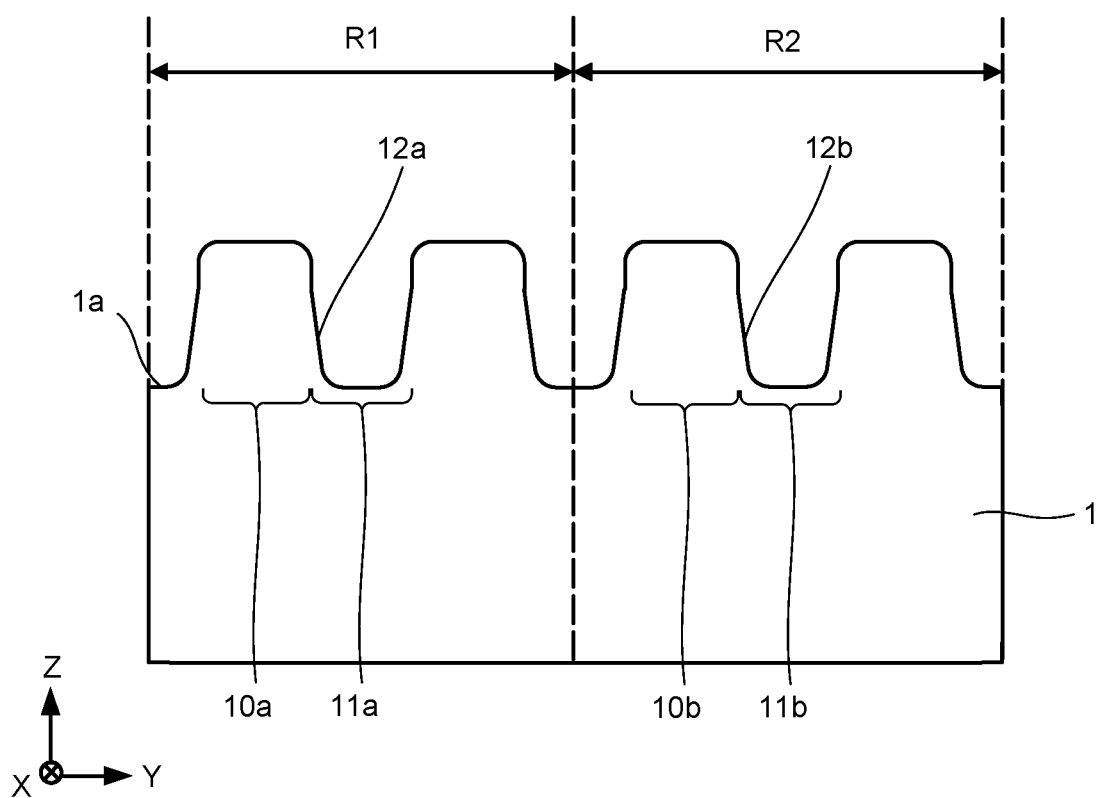
FIG. 13 is a schematic sectional view for explaining an example of a substrate preparation process S1.

FIG. 13 is a schematic sectional view for explaining an example of the substrate preparation process S1 and illustrates a part of a Y-Z cross section of a substrate 1. The substrate preparation process S1 can prepare the substrate 1 with a surface 1a, the surface 1a having a first pattern and a second pattern, the first pattern including a protrusion 10a and a depression 11a, and the second pattern including a protrusion 10b and a depression 11b.

An inner wall surface of the depression 11a illustrated in FIG. 13 has a tapered surface 12a which inclines to a bottom of the depression 11a. The tapered surface 12a and the bottom of the depression 11a form an obtuse angle therebetween. An inner wall surface of the depression 11b illustrated in FIG. 13 has a tapered surface 12b which inclines to a bottom of the depression 11b. The tapered surface 12b and the bottom of the depression 11b form an obtuse angle therebetween.

Providing the tapered surface 12a and the tapered surface 12b enables enlargement of a range of a collision angle of target particles reachable to the depression 11a and the depression 11b, so that it becomes possible to make the target particles easier to collide against the depression 11a and the depression 11b. Therefore, a processing rate can be enhanced. The tapered surface 12a and the tapered surface 12b can be formed by adjusting a forming condition of the depression 11a and the depression 11b, for example.

[Depression Processing Process S2]

The depression processing process S2 includes a protective film forming step S2-1, a protective film processing step S2-2, an exposed part processing step S2-3, and a protective film removing step S2-4, similarly to the first embodiment.

Figure 14:
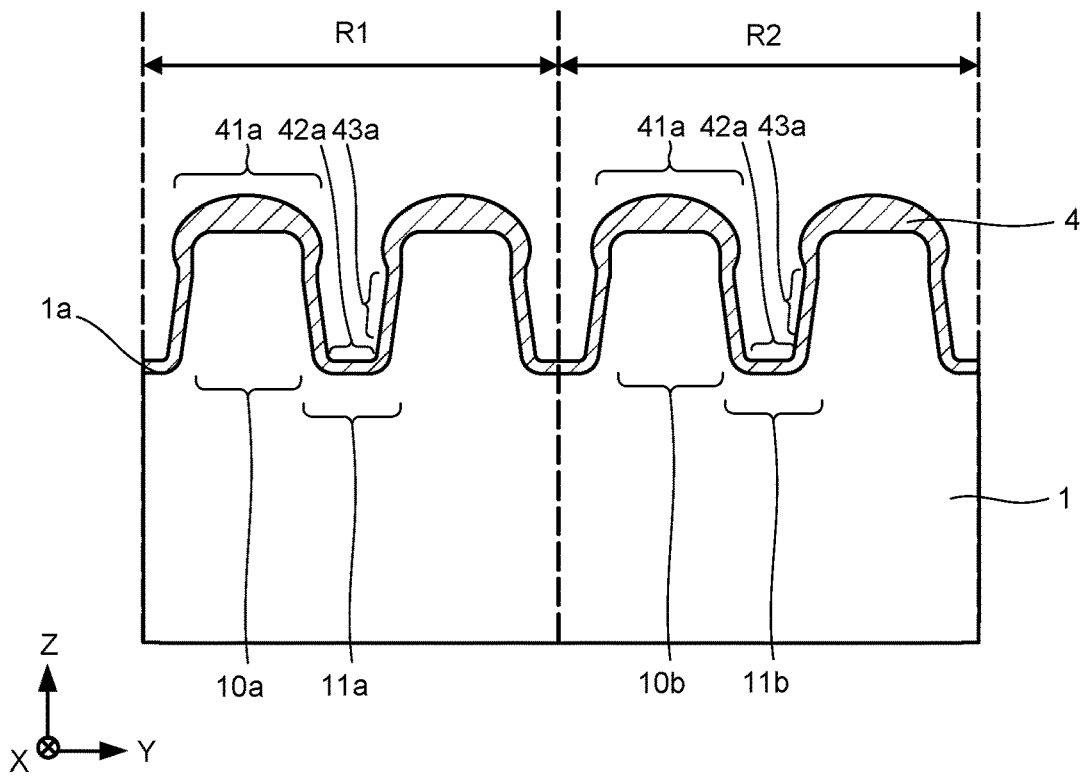
FIG. 14 is a schematic sectional view for explaining an example of a protective film forming step S2-1.

FIG. 14 is a schematic sectional view for explaining an example of the protective film forming step S2-1 and illustrates a part of the Y-Z cross section of the substrate 1. The protective film forming step S2-1 can form a protective film 4 on a surface 1a of the substrate 1. To other explanation of the protective film forming step S2-1, the explanation of the protective film forming step S2-1 of the first embodiment can be appropriately applied.

Figure 15:
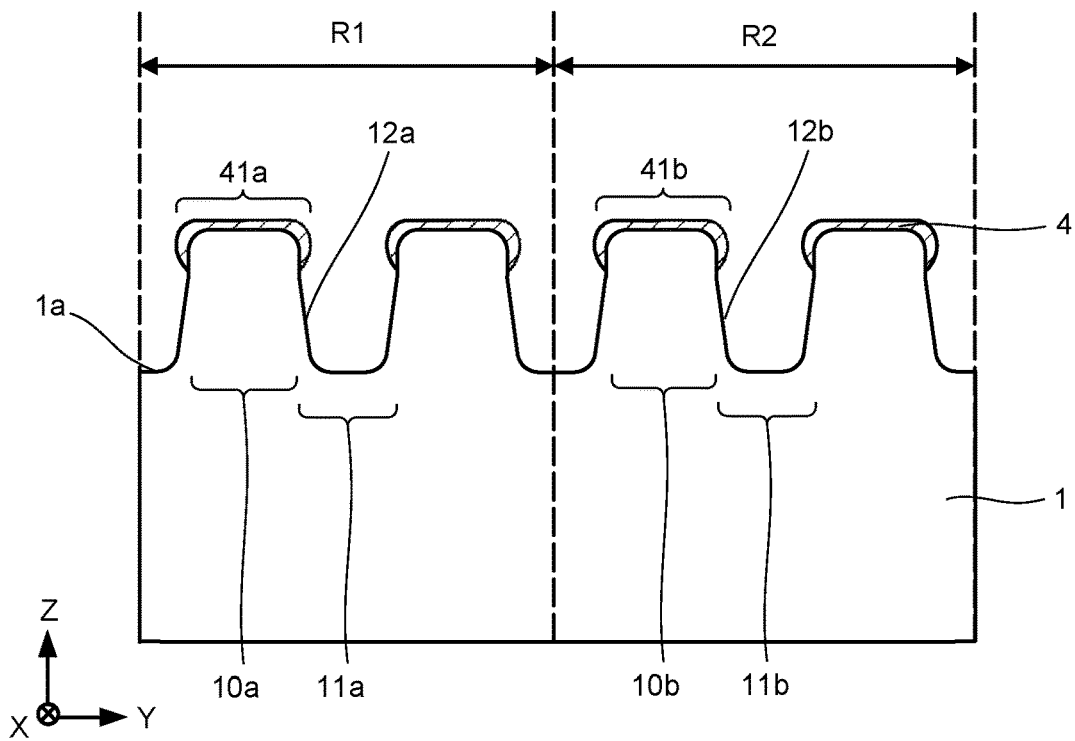
FIG. 15 is a schematic sectional view for explaining an example of a protective film processing step S2-2.

FIG. 15 is a schematic sectional view for explaining an example of the protective film processing step S2-2 and illustrates a part of the Y-Z cross section of the substrate 1. The protective film processing step S2-2 can remove a region 42a and a region 42b with a region 41a and a region 41b partly remaining, to thereby expose the bottom of the depression 11a and the bottom of the depression 11b. When the depression 11a has the tapered surface 12a and the depression 11b has the tapered surface 12b, a region 43a and a region 43b are also removed together with the region 42a and the region 42b, as illustrated in FIG. 15. To other explanation of the protective film processing step S2-2, the explanation of the protective film processing step S2-2 of the first embodiment can be appropriately applied.

Figure 17:
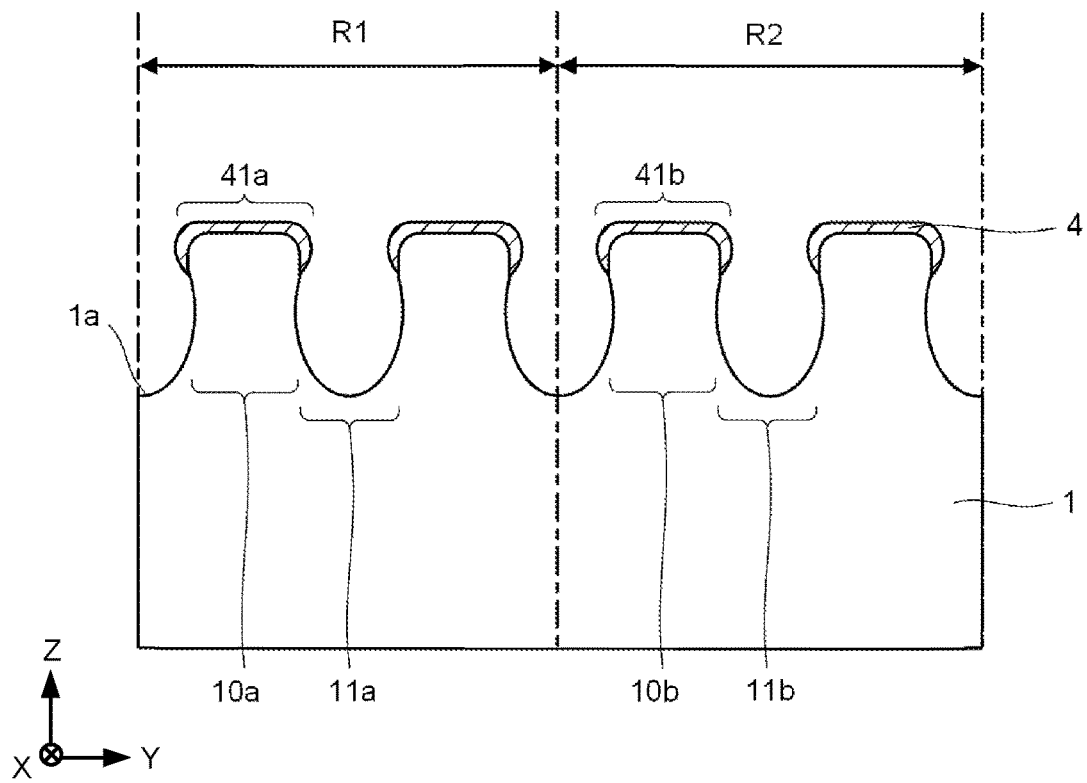
FIG. 17 is a schematic sectional view for explaining an example of an exposed part processing step S2-3.

FIG. 17 is a schematic sectional view for explaining an example of the exposed part processing step S2-3 and illustrates a part of the Y-Z cross section of the substrate 1. The exposed part processing step S2-3 can process an exposed part of the depression 11a and an exposed part of the depression 11b using the region 41a and the region 41b. This enables forming the depression 11a and the depression 11b to be further deep, for example. The exposed part of the depression 11a and the exposed part of the depression 11b are processed by dry processing, for example.

When the depression 11a has the tapered surface 12a and the depression 11b has the tapered surface 12b, the tapered surface 12a of the depression 11a and the tapered surface 12b of the depression 11b are also processed together with the bottoms of the depression 11a and the depression 11b, whereby the depression 11a and the depression 11b having oval sectional shapes, for example, can be formed as illustrated in FIG. 17. To other explanation of the exposed part processing step S2-3, the explanation of the exposed part processing step S2-3 of the first embodiment can be appropriately applied.

After the exposed part processing step S2-3, the protective film removing step S2-4 can remove the region 41a and the region 41b in similar to the protective film removing step S2-4 of the first embodiment. To other explanation of the protective film removing step S2-4, the explanation of the protective film removing step S2-4 of the first embodiment can be appropriately applied.

In the exposed part processing step S2-3, an adjustment of a processing condition, can remove the region 41a and the region 41b while the exposed part of the depression 11a and the exposed part of the depression 11b are processed. In such a case, the protective film removing step S2-4 is unnecessary.

Figure 16:
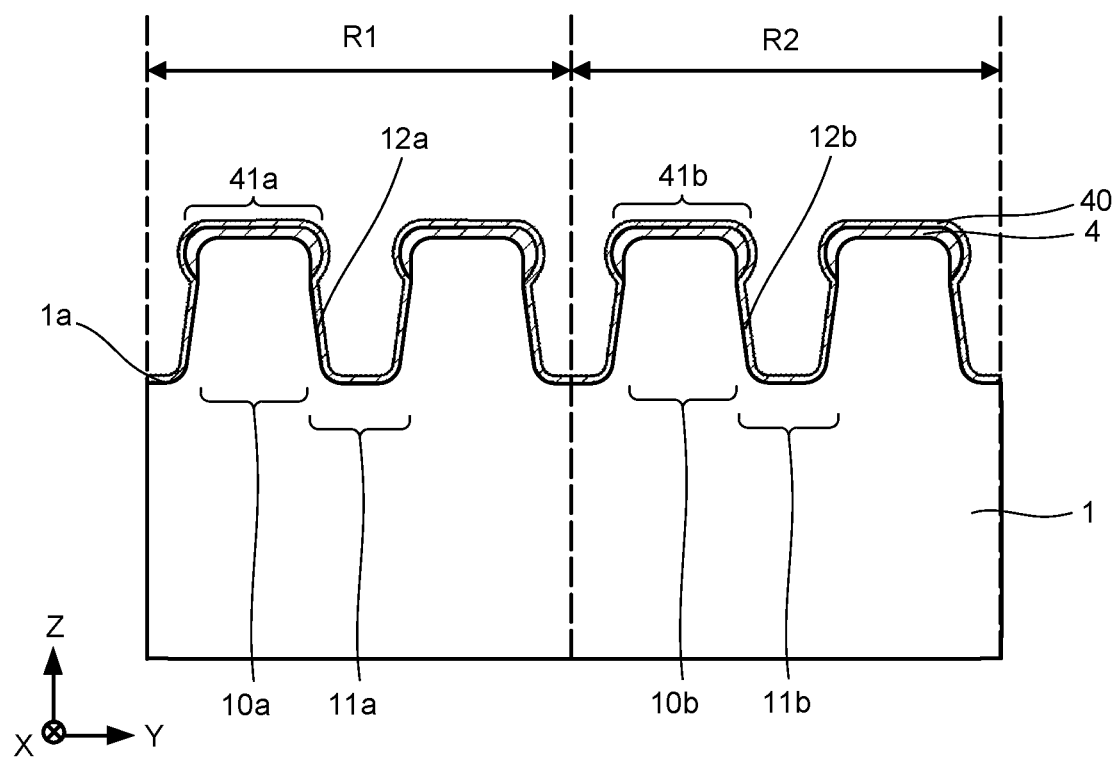
FIG. 16 is a schematic sectional view for explaining an example of a second protective film forming step.

The depression processing process S2 may further include a second protective film forming step between the protective film processing step S2-2 and the exposed part processing step S2-3. FIG. 16 is a schematic sectional view for explaining an example of the second protective film forming step. The second protective film forming step can form a protective film 40 onto the regions 41a and 41b and onto the exposed parts of the depressions 11a and 1 lb. The protective film 40 can improve the surface roughness of each of the regions 41a and 41b to enable each surface to be smoother. The protective film 40 preferably has a thickness larger than a maximum peak height of the surface roughness of each of the regions 41a and 41b. The protective film 40 is partly removed in regions overlapping the exposed parts of the depressions 11a and 11b before the exposed part processing step S2-3, similarly to the protective film 4.

[Optical Layer Forming Process S3]

Figure 18:
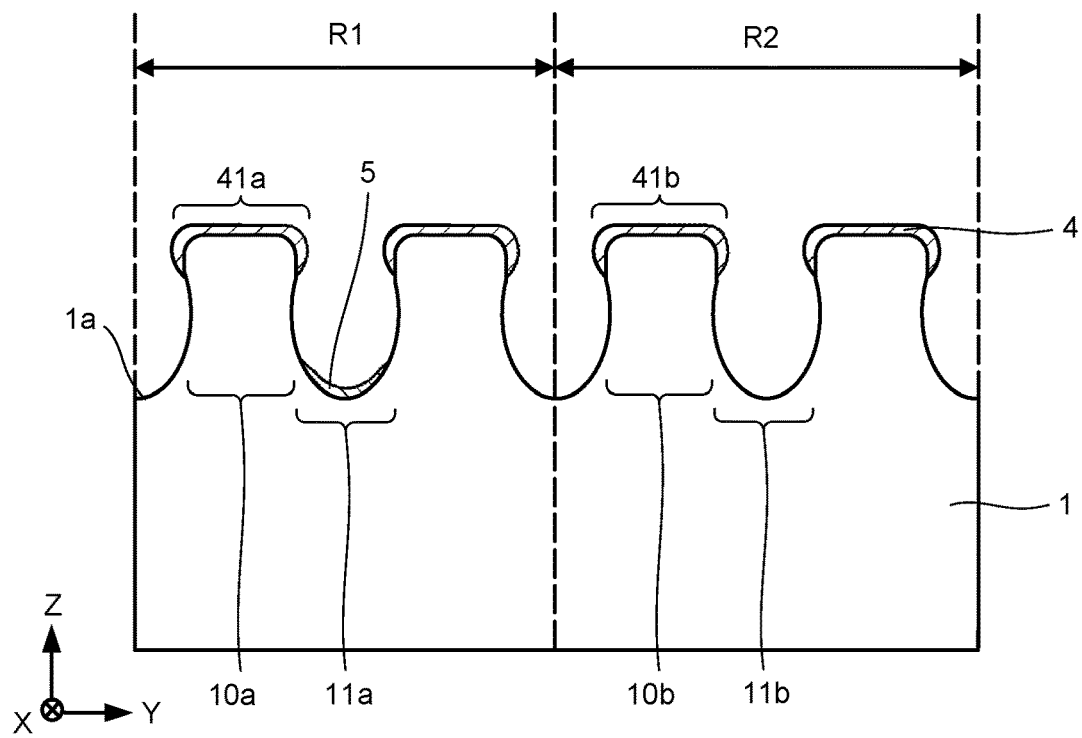
FIG. 18 is a schematic sectional view for explaining an example of the exposed part processing step S2-3.

FIG. 18 is a schematic sectional view for explaining an example of the exposed part processing step S2-3 and illustrates a part of the Y-Z cross section of the substrate 1. The optical layer forming process S3 can form an optical layer 5 in the depression 11a in similar to the optical layer forming process S3 of the first embodiment. To other explanation of the optical layer forming process S3, the explanation of the optical layer forming process S3 of the first embodiment can be appropriately applied.

As described above, the method example of the second embodiment, includes: forming a film on the surface of the substrate, the film including the first region, the second region and the third region, the first region being provided on the protrusion of the substrate, the second region being provided on the bottom of the depression, the second region being thinner than the first region, the third region being provided on the tapered surface of the depression, and the third region being thinner than the first region; removing the second region and the third region with the first region partly remaining to thereby expose the bottoms of the depressions and the tapered surface; and processing the exposed part of the depression using the mask made of the remainder of the first region.

The method example of the second embodiment, can expose and process the bottom of the depression using the difference in thickness between the first region and the second region, to form the depression to be further deep, for example. Therefore, the depth of the depression can be easily adjusted without a new template being manufactured. Further, exposing and processing of the tapered surface of the depression, can enlarge a width of the depression. Therefore, the width of the depression can be easily adjusted.

This embodiment can be appropriately combined with another embodiment.

Third Embodiment

A method example of manufacturing a template of a third embodiment has a substrate preparation process S1, a depression processing process S2, and an optical layer forming process S3, similarly to the method example of the first embodiment. In the third embodiment, explanation will be omitted for parts the same as those in the first embodiment and parts different from those in the first embodiment will be described in detail.

[Substrate Preparation Process S1]

Figure 19:
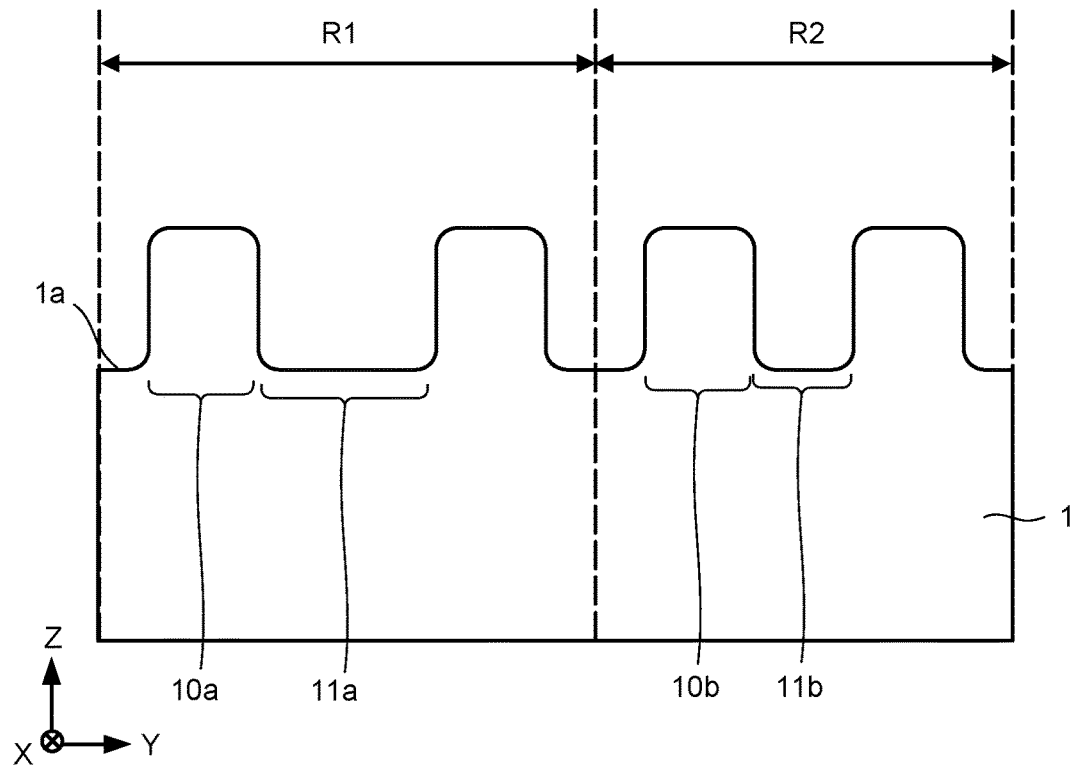
FIG. 19 is a schematic sectional view for explaining an example of a substrate preparation process S1.

FIG. 19 is a schematic sectional view for explaining an example of the substrate preparation process S1 and illustrates a part of a Y-Z cross section of a substrate 1. The substrate preparation process S1 can prepare the substrate 1 with a surface 1a, the surface 1a having a first pattern and a second pattern, the first pattern including a protrusion 10a and a depression 11a, and the second pattern including a protrusion 10b and a depression 11b. A width of the depression 11a illustrated in FIG. 19 is larger than a width of the depression 11b. The width of the depression 11a can be made larger than the width of the depression 11b by adjusting a pattern of a hard mask layer 2, for example.

[Depression Processing Process S2]

The depression processing process S2 includes a protective film forming step S2-1, a protective film processing step S2-2, an exposed part processing step S2-3, and a protective film removing step S2-4, similarly to the first embodiment.

Figure 20:
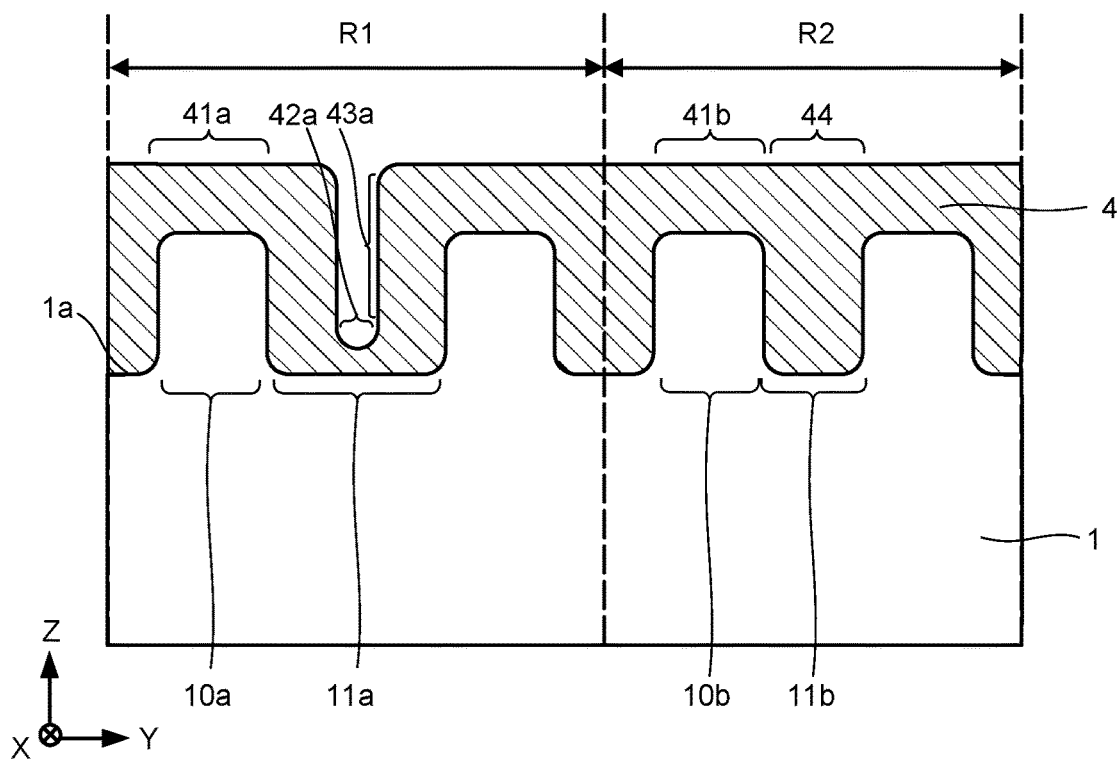
FIG. 20 is a schematic sectional view for explaining an example of a protective film forming step S2-1.

FIG. 20 is a schematic sectional view for explaining an example of the protective film forming step S2-1 and illustrates a part of the Y-Z cross section of the substrate 1. The protective film forming step S2-1 can form a protective film 4 on a surface 1a of the substrate 1.

The protective film 4 illustrated in FIG. 20 has a region 41a which is provided on a surface of the protrusion 10a, a region 42a which is provided on a bottom of the depression 11a and is thinner than the region 41a, a region 43a which is provided on an inner wall surface of the depression 11a and is thinner than the region 41a, a region 41b which is provided on a surface of the protrusion 10b, and a region 44 which is provided to fill up the depression 11b and is thicker than the region 42a. Not limited by the above configuration, it is acceptable to form a region 42a on the bottom of the depression 11a and to form a region 43a on the inner wall surface of the depression 11a, as well as to form a region 42b on the bottom of the depression 11b and to form a region 43b on the inner wall surface of the depression 11b, similarly to the protective film forming step S2-1 of the first embodiment. To other explanation of the protective film forming step S2-1, the explanation of the protective film forming step S2-1 of the first embodiment can be appropriately applied.

Figure 21:
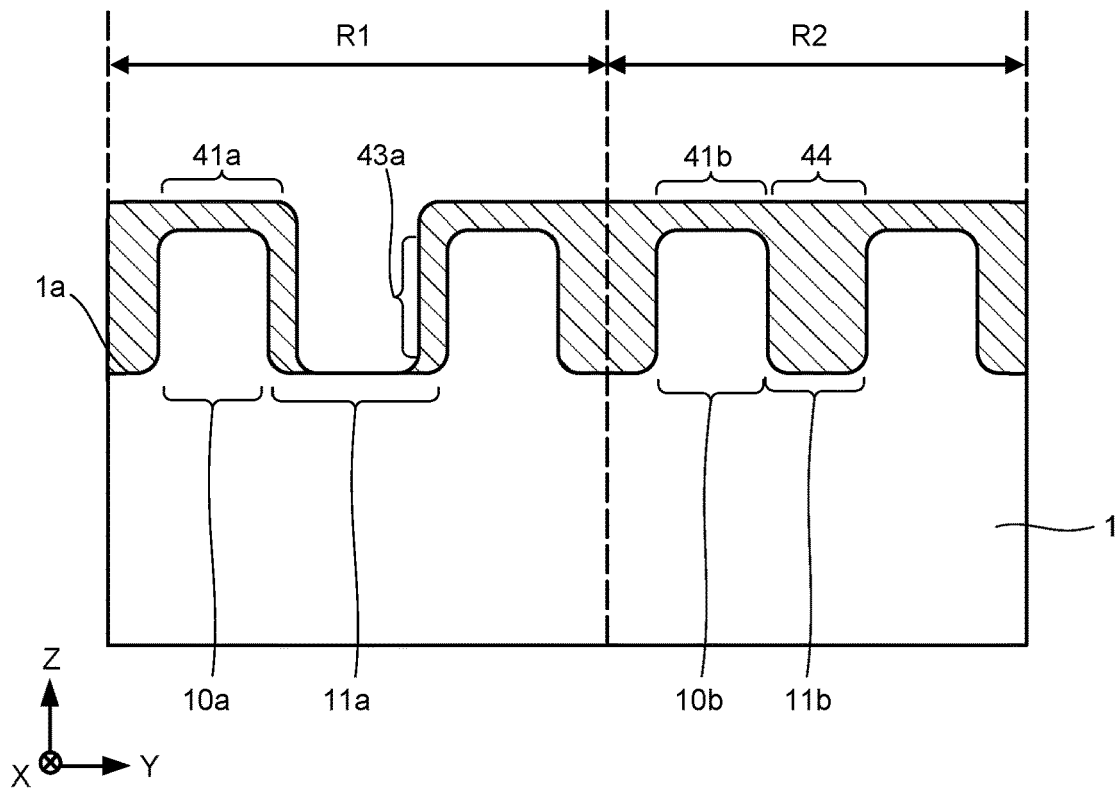
FIG. 21 is a schematic sectional view for explaining an example of a protective film processing step S2-2.

FIG. 21 is a schematic sectional view for explaining an example of the protective film processing step S2-2 and illustrates a part of the Y-Z cross section of the substrate 1. The protective film processing step S2-2 can remove the region 42a with the region 41a, the region 41b, the region 43a, and the region 44 partly remaining, to thereby expose the bottom of the depression 11a. To other explanation of the protective film processing step S2-2, the explanation of the protective film processing step S2-2 of the first embodiment can be appropriately applied.

Figure 22:
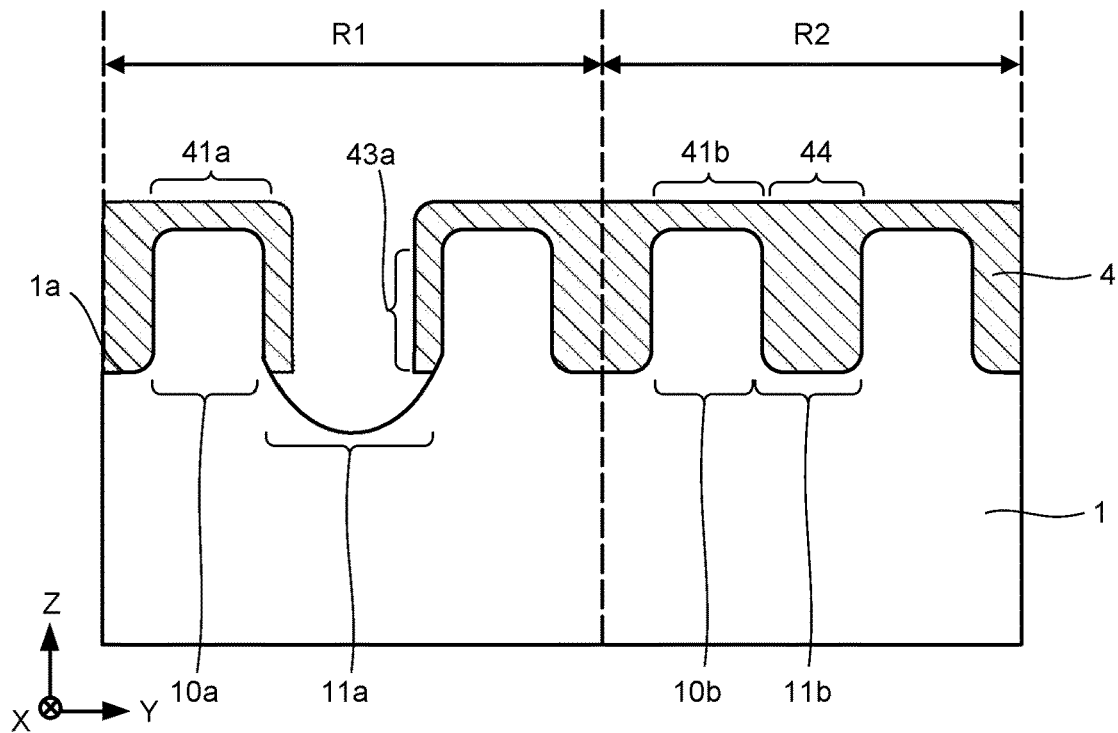
FIG. 22 is a schematic sectional view for explaining an example of an exposed part processing step S2-3.

FIG. 22 is a schematic sectional view for explaining an example of the exposed part processing step S2-3 and illustrates a part of the Y-Z cross section of the substrate 1. The exposed part processing step S2-3 can process an exposed part of the depression 11a using a mask made of a remainder of the region 41a, a remainder of the region 41b, a remainder of the region 43a, and a remainder of the region 44. This enables forming the depression 11a to be further deep, for example. The exposed part of the depression 11a is processed by dry processing, for example. To other explanation of the exposed part processing step S2-3, the explanation of the exposed part processing step S2-3 of the first embodiment can be appropriately applied.

After the exposed part processing step S2-3, the protective film removing step S2-4 can remove the region 41a, the region 41b, the region 43a, and the region 44 in similar to the protective film removing step S2-4 of the first embodiment. To other explanation of the protective film removing step S2-4, the explanation of the protective film removing step S2-4 of the first embodiment can be appropriately applied.

[Optical Layer Forming Process S3]

Figure 23:
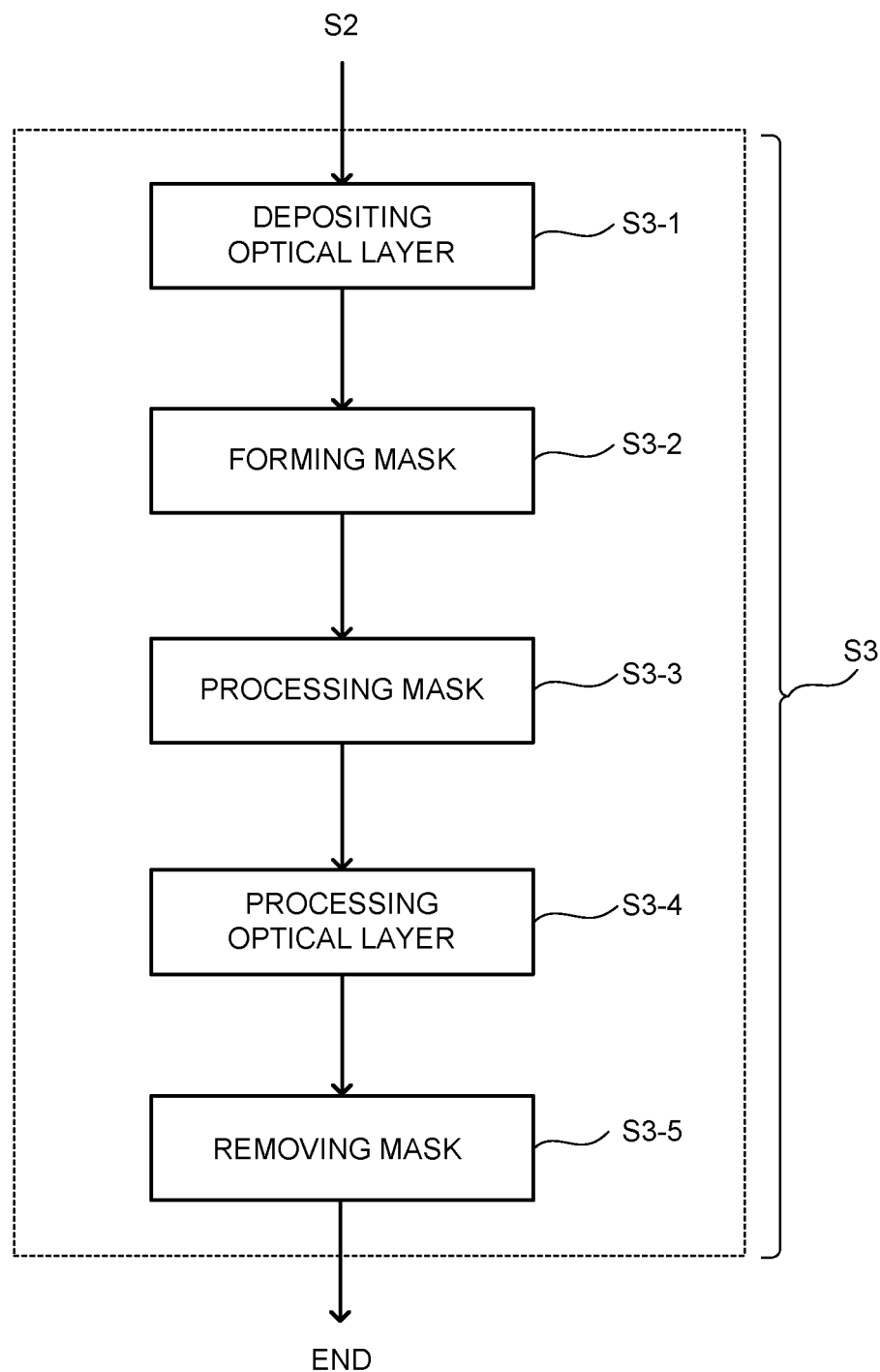
FIG. 23 is a flowchart for explaining an example of an optical layer forming process S3.

FIG. 23 is a flowchart for explaining an example of the optical layer forming process S3. The example of the optical layer forming process S3 includes an optical layer deposition step S3-1, a mask forming step S3-2, a mask processing step S3-3, an optical layer processing step S3-4, and a mask removing step S3-5.

Figure 24:
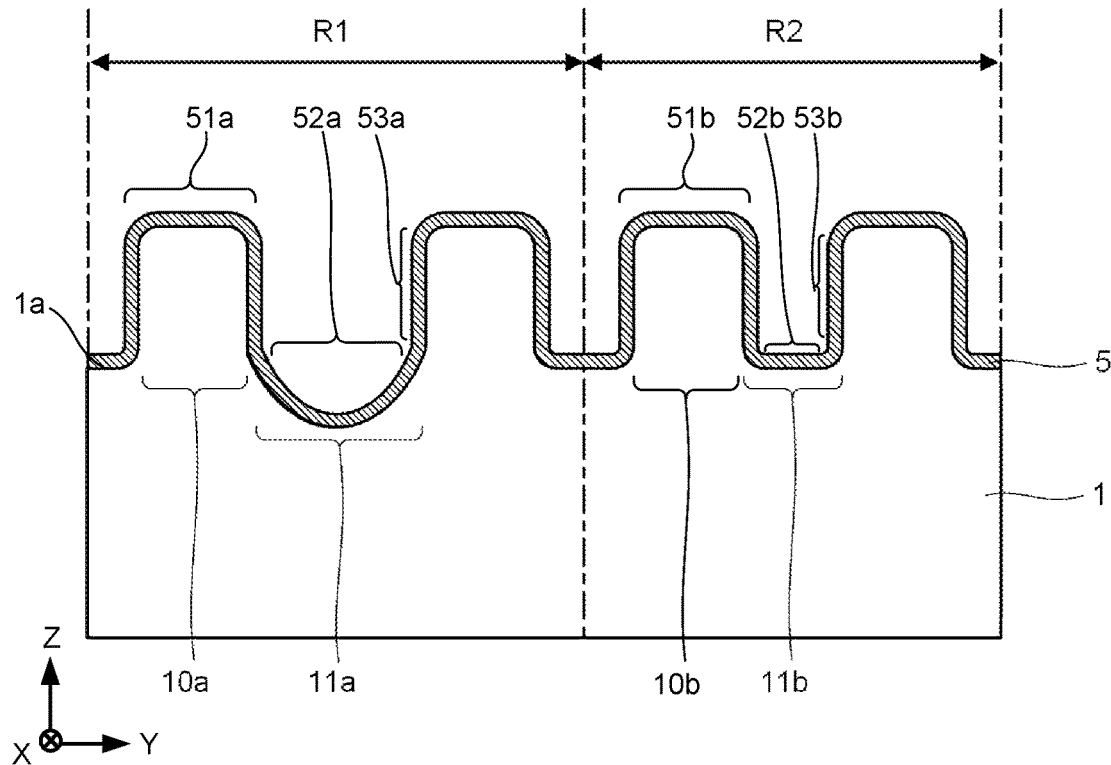
FIG. 24 is a schematic sectional view for explaining an example of an optical layer deposition step S3-1.

FIG. 24 is a schematic sectional view for explaining an example of the optical layer deposition step S3-1 and illustrates a part of the Y-Z cross section of the substrate 1. The optical layer deposition step S3-1 can deposit an optical layer 5 on a surface 1a. The optical layer 5 is formed by depositing a material applicable to the optical layer 5 on the surface 1a by sputtering, for example.

The optical layer 5 illustrated in FIG. 24 has a portion 51a provided on the surface of the protrusion 10a, a portion 52a provided on the bottom of the depression 11a, a portion 53a provided on the inner wall surface of the depression 11a, a portion 51b provided on the surface of the protrusion 11b, a portion 52b provided on the bottom of the depression 11b, and a portion 53b provided on the inner wall surface of the depression 11b.

Figure 25:
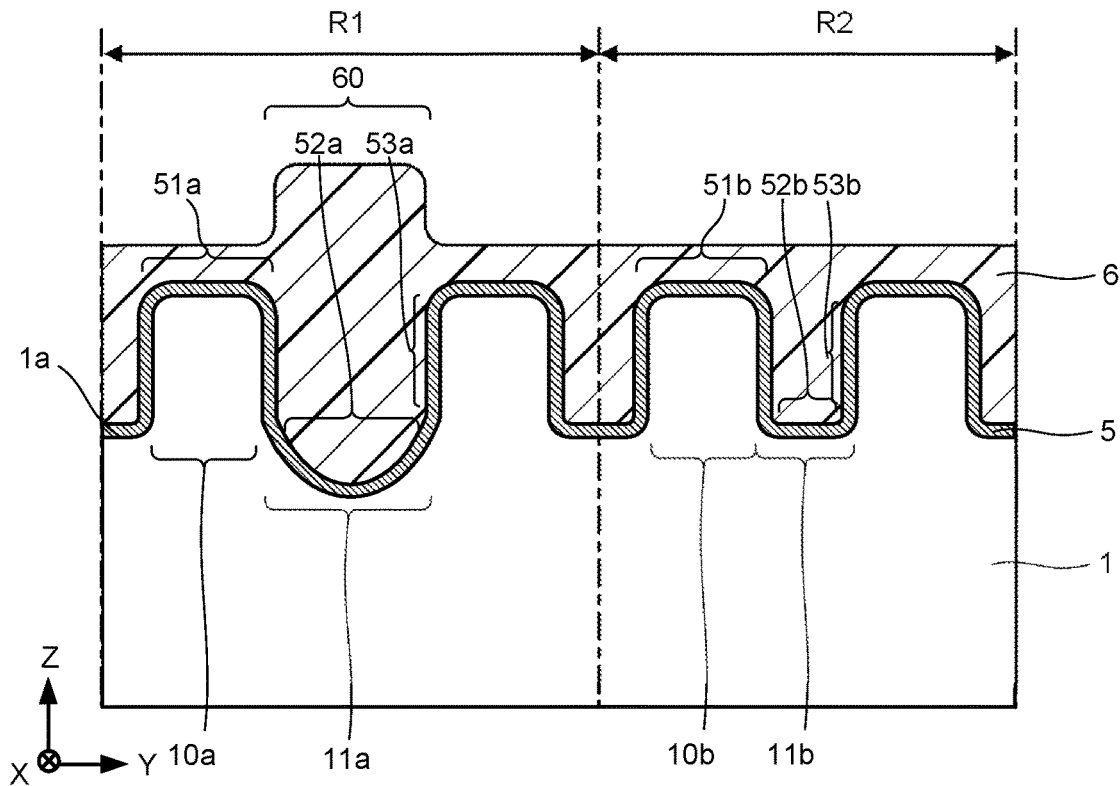
FIG. 25 is a schematic sectional view for explaining an example of a mask forming step S3-2.

FIG. 25 is a schematic sectional view for explaining an example of the mask forming step S3-2 and illustrates a part of the Y-Z cross section of the substrate 1. The mask forming step S3-2 can form a mask layer 6 on the optical layer 5. The mask layer 6 is a resist layer which includes a pattern formed using a method of forming a pattern using NIL, for example. The mask layer 6 covers the portion 51a, the portion 52a, the portion 53a, the portion 51b, the portion 52b, and the portion 53b and has a protrusion 60 which is provided above the depression 11a.

Figure 26:
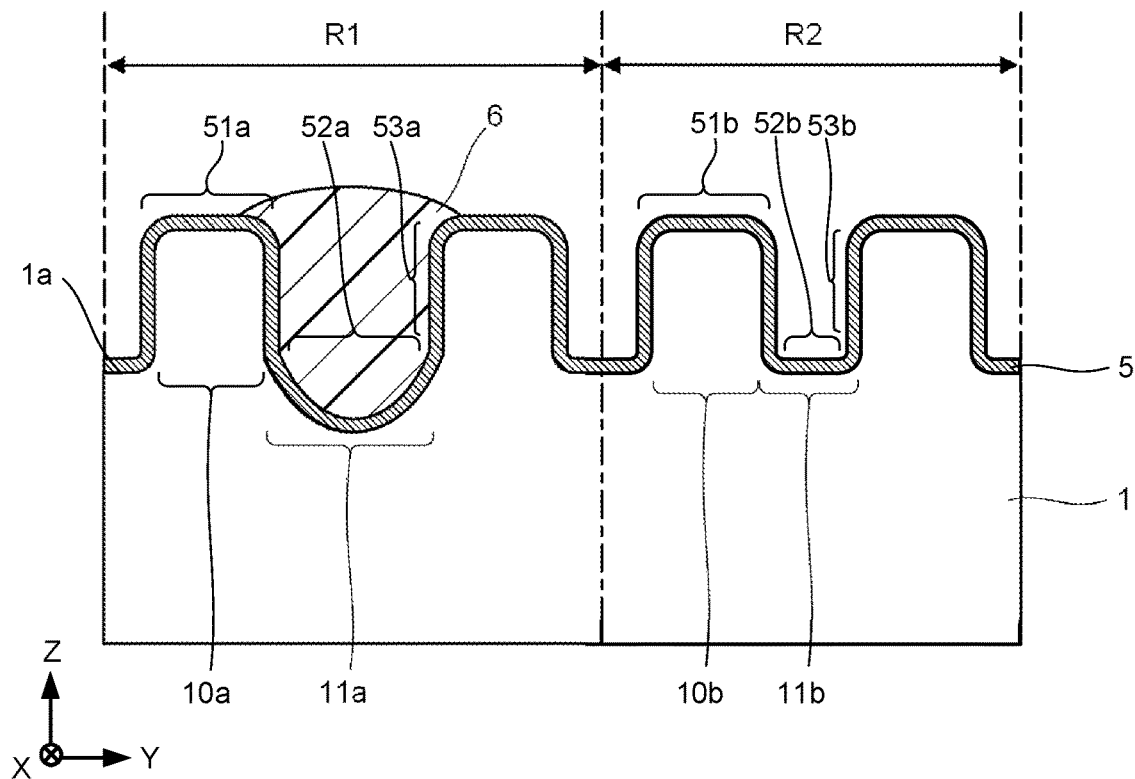
FIG. 26 is a schematic sectional view for explaining an example of a mask processing step S3-3.

FIG. 26 is a schematic sectional view for explaining an example of the mask processing step S3-3 and illustrates a part of the Y-Z cross section of the substrate 1. The mask processing step S3-3 can partly remove the mask layer 6 to thereby expose the portion 51a, the portion 53a, the portion 51b, the portion 52b, and the portion 53b with the portion 52b being covered. The mask layer 6 is processed by partly removing the mask layer 6 along a thickness direction (direction almost the same as a Z axis direction) of the mask layer 6 by dry processing, for example.

Figure 27:
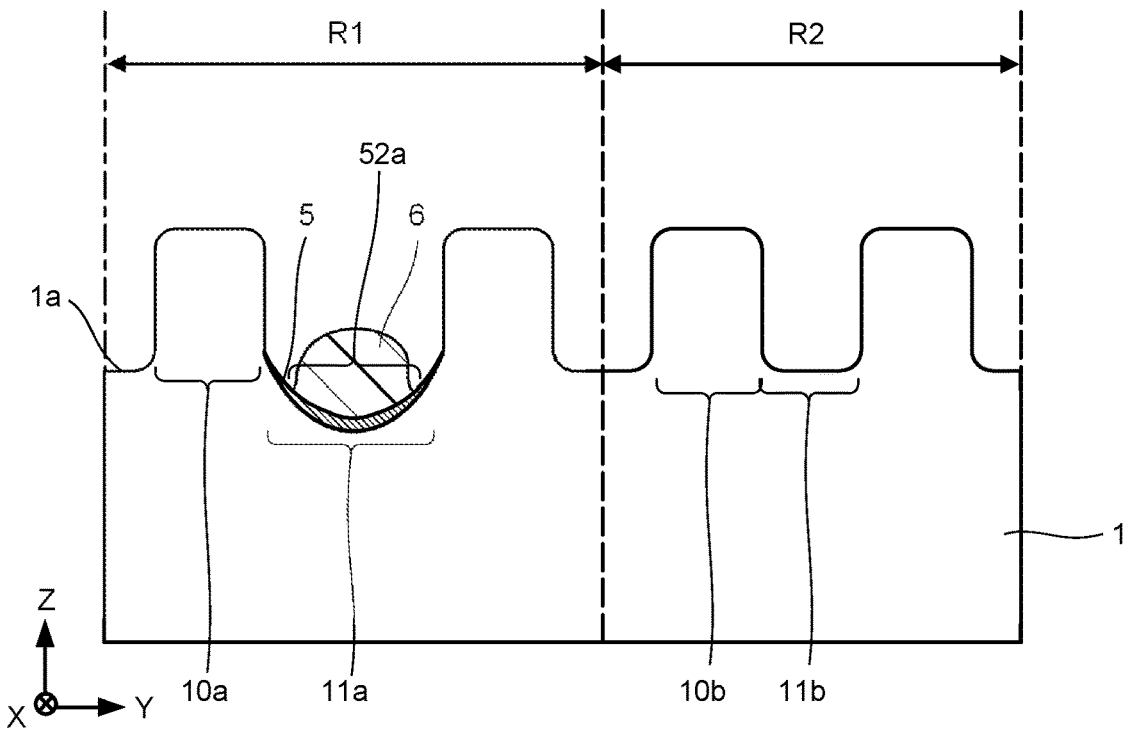
FIG. 27 is a schematic sectional view for explaining an example of an optical layer processing step S3-4.

FIG. 27 is a schematic sectional view for explaining an example of the optical layer processing step S3-4 and illustrates a part of the Y-Z cross section of the substrate 1. The optical layer processing step S3-4 can remove exposed parts (the portion 51a, the portion 53a, the portion 51b, the portion 52b, and the portion 53b) of the optical layer 5 using a remainder of the mask layer 6. The exposed part of the optical layer 5 can be removed by dry processing, for example. The mask layer 6 may also be removed together with the exposed part of the optical layer 5.

After the optical layer processing step S3-4, the mask removing step S3-5 can remove the mask layer 6. When the mask layer 6 is removed through the optical layer processing step S3-4, the mask removing step S3-5 is unnecessary. To other explanation of the optical layer forming process S3, the explanation of the example of the optical layer forming process S3 of the first embodiment can be appropriately applied.

(Other Structure Examples of Optical Layer)

Figure 28:
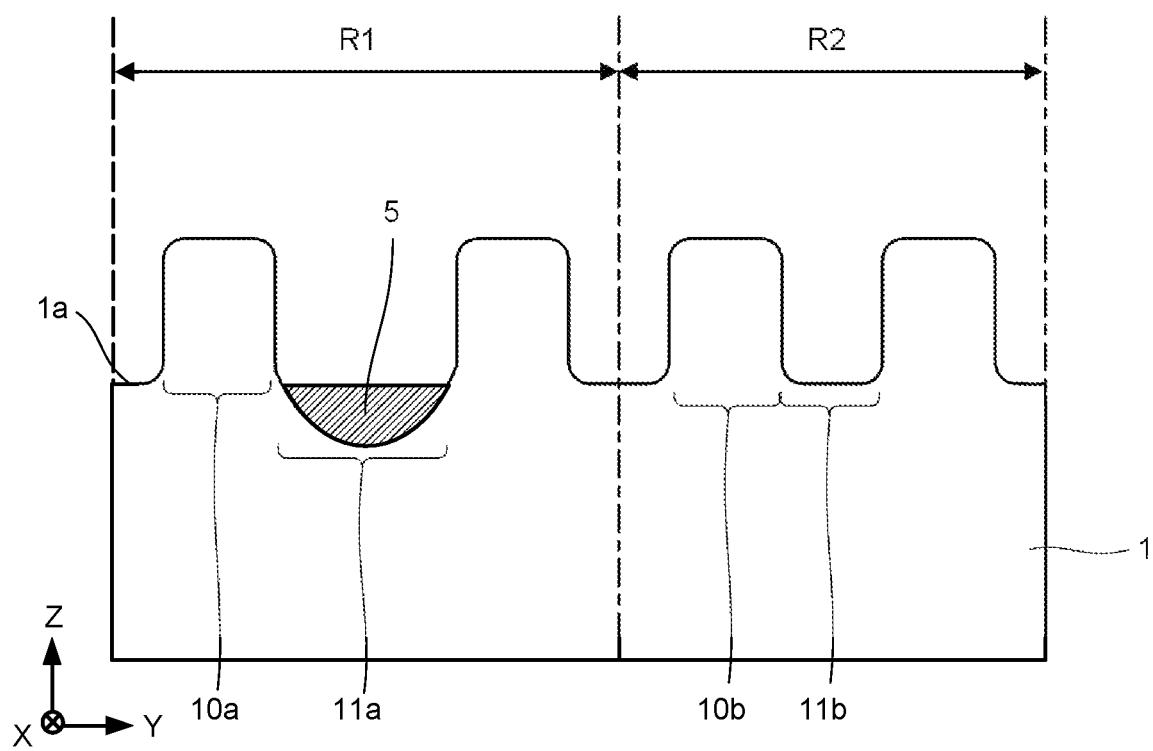
FIG. 28 is a schematic sectional view for explaining another structure example 8 of an optical layer.

A structure of the optical layer 5 is not limited to a structure illustrated in FIG. 27. FIG. 28 is a schematic sectional view for explaining another structure example of the optical layer and illustrates a part of the Y-Z cross section of the substrate 1. An exposed surface of an optical layer 5 illustrated in FIG. 28 is flat with a bottom of a depression 11b. This can adjust a depth to the exposed surface of the optical layer 5 of a depression 11a to be the same as a depth of the depression 11b. The optical layer 5 illustrated in FIG. 28 can be formed by adjusting a thickness of the optical layer 5 such that a surface of a region 52a is flat with the bottom of the depression 11b, for example, through an optical layer deposition step S3-1. To other explanation of the forming method of the optical layer 5 illustrated in FIG. 28, the explanation of examples of the optical layer deposition step S3-1 to the optical layer processing step S3-4 can be appropriately applied.

As described above, in the method example of the third embodiment, on the surface of the substrate is formed the film that includes the first region which is provided on the protrusion of the substrate, the second region which is provided on the bottom of the first depression and is thinner than the first region, and the fourth region which fills up the second depression, the second region is removed while a part of the first region and a part of the fourth region remain to thereby expose the bottom of the depression, and the exposed part of the depression is processed using the mask of remainders of the first region, the third region, and the fourth region.

In the method example of the third embodiment, the bottom of the depression is exposed and processed using a difference in thickness between the first region and the second region, whereby the depression can be made further deep, for example. Therefore, it is possible to adjust the depth of the depression easily without a new template being manufactured. Further, by making the width of the first depression larger than the width of the second depression, only the first depression can be made further deep, for example. Therefore, the present embodiment is suitable for adjustment of a depth of a depression of an alignment pattern, for example.

This embodiment can be appropriately combined with another embodiment.

While certain embodiments of the present invention have been described, these embodiments have been presented by way of example only, and are not intended to limit the scope of the inventions. The novel embodiments described herein may be embodied in a variety of other forms; furthermore, various omissions, substitutions and changes may be made therein without departing from the spirit of the inventions. The accompanying claims and their equivalents are intended to cover such forms or modifications as would fall within the scope and spirit of the inventions.

What is claimed is:

1. A method of manufacturing a template, comprising:
   forming a first mask layer on a surface of a substrate, the substrate containing quartz, and the first mask layer containing chromium;
   forming a second mask layer on a part of the first mask layer containing photoresist;
   processing the first mask layer using the second mask layer to form a pattern of the first mask layer;
   processing the substrate using the first mask layer with the pattern to form a protrusion and a depression on the surface; and
   processing the depression,
   the processing of the depression, including:
   a first step of forming a film on the surface of the substrate from which the first and second mask layers are removed, the film including a first region and a second region, the first region being provided on the protrusion, and the second region being provided on a bottom of the depression and being thinner than the first region;
   a second step of removing the second region with the first region partly remaining to expose the bottom of the depression; and
   a third step of processing the exposed part of the depression using a mask made of the remainder of the first region.

2. The method according to claim 1, wherein the film contains chromium.

3. The method according to claim 2, wherein the second region is removed by dry etching or ashing using plasma generated from gas containing chlorine and oxygen.

4. The method according to claim 1, wherein the film contains carbon.

5. The method according to claim 4, wherein the film is a diamond-like carbon film.

6. The method according to claim 4, wherein the second region is removed by dry etching or ashing using plasma generated from gas containing oxygen or nitrogen.

7. The method according to claim 1, wherein the exposed part of the depression is processed by dry etching or ashing using plasma generated from gas containing tetrafluoromethane.

8. The method according to claim 1, wherein the processing of the depression is repeated.

9. The method according to claim 1, wherein before the processing of the depression, an inner wall surface of the depression of the substrate has a tapered surface inclining to the bottom thereof,
   the film further includes a third region, the third region being provided on the tapered surface and being thinner than the first region, and
   the second step includes removing the second and third regions with the first region partly remaining to expose the bottom and the tapered surface.

10. The method according to claim 1, further comprising:
forming an optical layer on the depression after removing the film.

11. The method according to claim 1, wherein
the surface further includes a second depression,
a width of the depression is larger than a width of the second depression,
the film further includes a fourth region, the fourth region filling the second depression and being thicker than the second region, and
the second region is removed with each of the first and fourth regions partly remaining.

12. The method according to claim 11, further comprising:
forming an optical layer in the depression after removing the film,
the forming of the optical layer, including:
  a fourth step of forming an optical layer, the optical layer including a first portion provided on the protrusion, a second portion provided on the depression, and a third portion provided on the second depression;
  a fifth step of forming a third mask layer on the optical layer, the mask layer covering the first to third portions and having a protruding portion above the second portion;
  a sixth step of partly removing the third mask layer to expose the first and third portions with covering the second portion, and
  a seventh step of removing the first and third portions using the remainder of the third mask layer.

13. A method of forming a pattern, comprising:
forming a first mask layer on a surface of a substrate, the substrate containing quartz, and the first mask layer containing chromium;
forming a second mask layer on a part of the first mask layer containing photoresist;
processing the first mask layer using the second mask layer to form a pattern of the first mask layer;
processing the substrate using the first mask layer with the pattern to form a protrusion and a depression on the surface; and
processing the depression,
the processing of the depression, including:
  a first step of forming a film on the surface of the substrate from which the first and second mask layers are removed, the film including a first region and a second region, the first region being provided on the protrusion, and the second region being provided on a bottom of the depression and being thinner than the first region;
  a second step of removing the second region with the first region partly remaining to expose the bottom of the depression; and
  a third step of processing the exposed part of the depression using a mask made of the remainder of the first region.

14. A method of manufacturing a template, comprising:
preparing a substrate containing quartz and having a surface, the surface including a protrusion and a depression; and
processing the depression,
the processing of the depression, including:
  a first step of forming a film on the surface, the film including a first region and a second region, the first region being provided on the protrusion, and the second region being provided on a bottom of the depression and being thinner than the first region;
  a second step of removing the second region with the first region partly remaining to expose the bottom of the depression; and
  a third step of processing the exposed part of the depression using a mask made of the remainder of the first region,
wherein the surface further includes a second depression,
a width of the depression is larger than a width of the second depression,
the film further includes a fourth region, the fourth region filling the second depression and being thicker than the second region, and
the second region is removed with each of the first and fourth regions partly remaining.

15. The method according to claim 14, further comprising:
forming an optical layer in the depression after removing the film,
the forming of the optical layer, including:
  a fourth step of forming an optical layer, the optical layer including a first portion provided on the protrusion, a second portion provided on the depression, and a third portion provided on the second depression;
  a fifth step of forming a mask layer on the optical layer, the mask layer covering the first to third portions and having a protruding portion above the second portion;
  a sixth step of partly removing the mask layer to expose the first and third portions with covering the second portion, and
  a seventh step of removing the first and third portions using the remainder of the mask layer.

* * * * *